(12) United States Patent
Nishio et al.

(10) Patent No.: US 9,012,923 B2
(45) Date of Patent: Apr. 21, 2015

(54) SEMICONDUCTOR DEVICE

(71) Applicant: Kabushiki Kaisha Toshiba, Minato-ku (JP)

(72) Inventors: Johji Nishio, Machida (JP); Tatsuo Shimizu, Shinagawa (JP); Ryosuke Iijima, Setagaya (JP); Chiharu Ota, Kawasaki (JP); Takashi Shinohe, Yokosuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/448,345

(22) Filed: Jul. 31, 2014

(65) Prior Publication Data

US 2015/0034974 A1 Feb. 5, 2015

(51) Int. Cl.
*H01L 29/15* (2006.01)
*H01L 29/36* (2006.01)
*H01L 29/16* (2006.01)
(Continued)

(52) U.S. Cl.
CPC ............ *H01L 29/36* (2013.01); *H01L 29/1608* (2013.01); *H01L 29/167* (2013.01); *H01L 29/78* (2013.01)

(58) Field of Classification Search
CPC ............... H01L 29/1608; H01L 29/66068; H01L 29/7802; H01L 29/7395; H01L 21/02529; H01L 21/02236; H01L 21/02447; H01L 21/0243; H01L 21/02579; H01L 29/0856; H01L 29/0873; H01L 23/4827; H01L 2924/01005; H01L 2924/01013; H01L 2924/10272; H01L 2924/13055
USPC ...................... 257/77, E21.054; 438/105, 931
See application file for complete search history.

(56) References Cited

U.S. PATENT DOCUMENTS 5,831,288 A 11/1998 Singh et al.
6,316,791 B1 * 11/2001 Schorner et al. ................. 257/77
(Continued)

FOREIGN PATENT DOCUMENTS

JP 11-16840 1/1999
JP 2000-509559 7/2000
(Continued)

OTHER PUBLICATIONS

U.S. Appl. No. 14/448,287, filed Jul. 31, 2014, Johji Nishio, et al.
(Continued)

*Primary Examiner* — Duy T Nguyen
(74) *Attorney, Agent, or Firm* — Oblon, McClelland, Maier & Neustadt, L.L.P.

(57) ABSTRACT

A semiconductor device of an embodiment includes: an n-type first SiC epitaxial layer; a p-type second SiC epitaxial layer on the first SiC epitaxial layer containing a p-type impurity and an n-type impurity, the p-type impurity being an element A, the n-type impurity being an element D, the element A and the element D forming a combination of Al, Ga, or In and N, and/or a combination of B and P, the ratio of the concentration of the element D to the element A being higher than 0.33 but lower than 1.0; a surface region at the surface of the second SiC epitaxial layer containing the element A at a lower concentration than in the second SiC epitaxial layer, the ratio being higher than in the second SiC epitaxial layer; n-type first and second SiC regions; a gate insulating film; a gate electrode; a first electrode; and a second electrode.

10 Claims, 15 Drawing Sheets

(51) Int. Cl.
*H01L 29/167* (2006.01)
*H01L 29/78* (2006.01)

(56) References Cited

U.S. PATENT DOCUMENTS

| | | | |
|---|---|---|---|
| 7,214,984 B2 | 5/2007 | Uchida et al. | |
| 2002/0038891 A1* | 4/2002 | Ryu et al. | 257/350 |
| 2008/0296771 A1* | 12/2008 | Das et al. | 257/758 |
| 2012/0056195 A1* | 3/2012 | Kono et al. | 257/77 |
| 2014/0127910 A1 | 5/2014 | Hieno et al. | |

FOREIGN PATENT DOCUMENTS

| | | |
|---|---|---|
| JP | 2004-519842 | 7/2004 |
| JP | 3600406 | 12/2004 |
| JP | 2005-183943 | 7/2005 |
| JP | 2010-53035 | 3/2010 |
| JP | 2013-059828 | 3/2013 |
| JP | 2013-059829 | 3/2013 |
| JP | 2013-160781 | 8/2013 |
| JP | 2014-96204 A | 5/2014 |

OTHER PUBLICATIONS

U.S. Appl. No. 14/205,914, filed Mar. 12, 2014, Tatsuo Shimizu, et al.
U.S. Appl. No. 14/205,887, filed Mar. 12, 2014, Tatsuo Shimizu, et al.

* cited by examiner

SEMICONDUCTOR DEVICE

CROSS-REFERENCE TO RELATED APPLICATION

This application is based upon and claims the benefit of priority from Japanese Patent Application No. 2013-160782, filed on Aug. 1, 2013, the entire contents of which are incorporated herein by reference.

FIELD

Embodiments described herein relate generally to a semiconductor device.

BACKGROUND

SiC (silicon carbide) is expected to be a material for next-generation power semiconductor devices. SiC has excellent physical properties, having a band gap three times wider than that of Si (silicon), a breakdown field strength approximately 10 times higher than that of Si, and a heat conductivity approximately three times higher than that of Si. A power semiconductor device that has low energy loss and is capable of high-temperature operation can be realized by taking advantage of those properties.

Meanwhile, the drawback of SiC is that the mobility of carriers becomes lower due to residual defects or the like.

DETAILED DESCRIPTION

Figure 1:
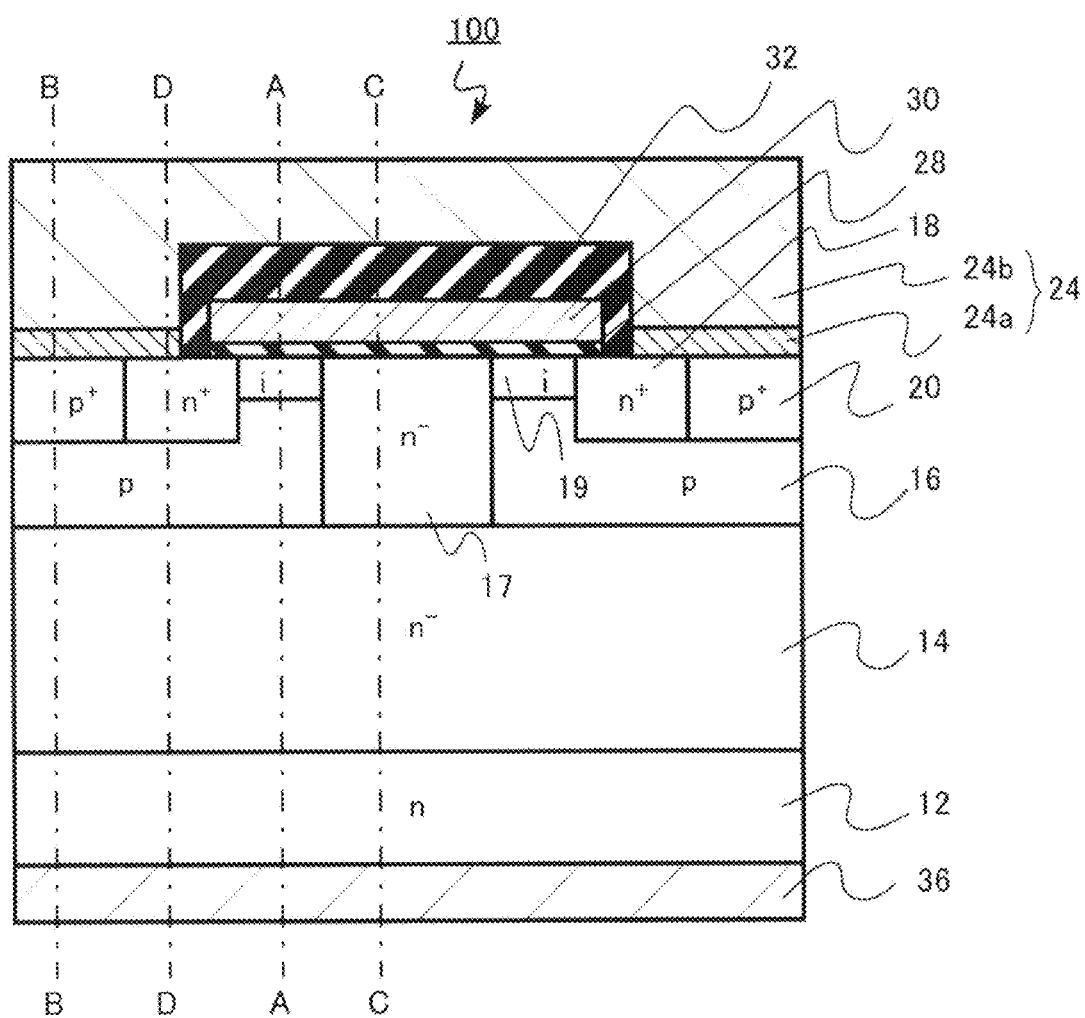
FIG. 1 is a schematic cross-sectional view of a semiconductor device of a first embodiment.

A semiconductor device of an embodiment includes: an n-type first SiC epitaxial layer; a p-type second SiC epitaxial layer provided on the first SiC epitaxial layer, the p-type second SiC epitaxial layer containing a p-type impurity and an n-type impurity, the p-type impurity being an element A, the n-type impurity being an element D, the element A and the element D forming at least one of a first combination or a second combination, the first combination being a combination of the element A selected from a group consisting of Al (aluminum), Ga (gallium), and In (indium) and the element D being N (nitrogen), the second combination being a combination of the element A being B (boron) and the element D being P (phosphorus), a ratio of a concentration of the element D to a concentration of the element A in the at least one of the combinations being higher than 0.33 but lower than 1.0; a surface region provided at a surface of the p-type second SiC epitaxial layer, the surface region containing the element A at a lower concentration than the concentration of the element A in the p-type second SiC epitaxial layer, a ratio of a concentration of the element D to the concentration of the element A in the at least one of the combinations being higher than the ratio in the p-type second SiC epitaxial layer; an n-type first SiC region provided at the surface of the p-type second SiC epitaxial layer, the n-type first SiC region having a depth equal to or greater than a thickness of the p-type second SiC epitaxial layer; an n-type second SiC region provided at the surface of the p-type second SiC epitaxial layer, the n-type second SiC region being separated from the n-type first SiC region, the n-type second SiC region having a depth smaller than the thickness of the p-type second SiC epitaxial layer; a gate insulating film provided on the surface region; a gate electrode provided on the gate insulating film; a first electrode provided on the n-type second SiC region; and a second electrode provided on the opposite side of the n-type first SiC epitaxial layer from the first electrode.

The following is a description of embodiments, with reference to the accompanying drawings. In the following description, like components are denoted by like reference numerals, and explanation of components described once will not be repeated.

In the following description, $n^+$, $n$, $n^-$, $p^+$, $p$, and $p^-$ indicate relative levels of impurity concentrations in the respective conductivity types. Specifically, the concentration of an $n^+$-type impurity is relatively higher than the concentration of the corresponding n-type impurity, and the concentration of an $n^-$-type impurity is relatively lower than the concentration of the corresponding n-type impurity. Likewise, the concentration of a $p^+$-type impurity is relatively higher than the concentration of the corresponding p-type impurity, and the concentration of a $p^-$-type impurity is relatively lower than the concentration of the corresponding p-type impurity. It should be noted that there are cases where an $n^+$ type and an $n^-$ type are referred to simply as an n-type, and a $p^+$ type and a $p^-$ type are referred to simply as a p-type.

First Embodiment

A semiconductor device of this embodiment includes: an n-type first SiC epitaxial layer; a p-type second SiC epitaxial layer that is formed on the first SiC epitaxial layer and contains a p-type impurity and an n-type impurity, the p-type impurity being an element A, the n-type impurity being an element D, the element A and the element D forming a combination of Al (aluminum), Ga (gallium), or In (indium) and N (nitrogen), and/or a combination of B (boron) and P (phosphorus), the ratio of the concentration of the element D to the concentration of the element A in the combination (s) being higher than 0.33 but lower than 1.0; a surface region that is formed at the surface of the second SiC epitaxial layer and contains the element A at a lower concentration than the concentration of the element A in the second SiC epitaxial layer, the ratio of the concentration of the element D to the concentration of the element A in a combination being higher than that in the p-type second SiC epitaxial layer; an n-type first SiC region that is formed at the surface of the second SiC epitaxial layer, and has a depth equal to or greater than the thickness of the second SiC epitaxial layer; an n-type second SiC region that is formed at a distance from the n-type first SiC region in the surface of the second SiC epitaxial layer, and has a depth smaller than the thickness of the second SiC epitaxial layer; a gate insulating film formed on the surface region; a gate electrode formed on the gate insulating film; a first electrode formed on the second SiC region; and a second electrode formed on the opposite side of the first SiC epitaxial layer from the first electrode.

In this embodiment, the ratio of the concentration of the element D to the concentration of the element A in the surface region is preferably not lower than 0.9 and not higher than 1.1.

FIG. 1 is a schematic cross-sectional view of the structure of a MOSFET (Metal Oxide Semiconductor Field Effect Transistor) that is a semiconductor device of this embodiment. The MOSFET 100 is an n-type vertical MOSFET that has electrons as carriers.

This MOSFET 100 includes an n-type SiC substrate (an n-type SiC layer) 12 that has first and second planes. In FIG. 1, the first plane is the upper plane, and the second plane is the lower plane. This SiC substrate 12 is a 4H—SiC substrate (an n-substrate) containing N (nitrogen) as the n-type impurity at an impurity concentration that is not lower than $1 \times 10^{18}$ cm$^{-3}$ and not higher than $1 \times 10^{19}$ cm$^{-3}$, for example.

An n-type first SiC epitaxial layer (an n$^-$-SiC layer) 14 containing the n-type impurity at an impurity concentration that is not lower than $5 \times 10^{15}$ cm$^{-3}$ and not higher than $2 \times 10^{16}$ cm$^{-3}$, for example, is formed on the first plane of the SiC substrate 12. The thickness of the n$^-$-SiC layer 14 is not smaller than 5 μm and not greater than 10 μm, for example.

A p-type second SiC epitaxial layer (a p-well region) 16 containing a p-type impurity at an impurity concentration that is not lower than $1 \times 10^{16}$ cm$^{-3}$ and not higher than $5 \times 10^{17}$ cm$^{-3}$, for example, is formed on the n$^-$-SiC layer 14. The thickness of the p-well region 16 is not smaller than 0.3 μm and not greater than 1.0 μm, for example.

The p-type second SiC epitaxial layer (the p-well region) 16 is co-doped with a p-type impurity (a first p-type impurity) and an n-type impurity (a first n-type impurity). Where the p-type impurity is an element A and the n-type impurity is an element D, the element A and the element D form a combination of Al (aluminum), Ga (gallium), or In (indium) and N (nitrogen) (a first combination), and/or a combination of B (boron) and P (phosphorus) (a second combination). The ratio of the concentration of the element D to the concentration of the element A in the above combination (s) is higher than 0.33 but lower than 1.0. The concentration of the element A forming part of the above combination (s) is preferably not lower than $1 \times 10^{16}$ cm$^{-3}$ and not higher than $5 \times 10^{17}$ cm$^{-3}$, so as to set an appropriate threshold value in the MOSFET 100.

In the case of the first combination of Al (aluminum), Ga (gallium), or In (indium) and N (nitrogen), for example, the element A may be a single element selected from Al (aluminum), Ga (gallium), and In (indium). Alternatively, the element A may be formed with two elements such as Al (an element $A_1$) and Ga (an element $A_2$) or may be formed with three elements such as Al (the element $A_1$), Ga (the element $A_2$), and In (an element $A_3$). In a case where the element A is formed with more than one element, the element A may be formed with two or three kinds of elements, as long as the above described conditions on the ratio of the concentration of the element D to the concentration of the element A and on the concentration of the element A are satisfied.

The first combination and the second combination can coexist. However, the above described conditions on the ratio of the concentration of the element D to the concentration of the element A and on the concentration of the element A should be satisfied with elements that form at least one of the first and second combinations. In other words, each of the first combination and the second combination should satisfy the conditions on the element ratio and the element concentration. This is because the later described trimers are not formed between an impurity in the first combination and an impurity in the second combination.

In a case where the Al concentration is $1 \times 10^{17}$ cm$^{-3}$, the Ga concentration is $1 \times 10^{17}$ cm$^{-3}$, and the N concentration is $1 \times 10^{17}$ cm$^{-3}$, for example, N/(Al+Ga) is 0.5, and (Al+Ga) is $2 \times 10^{17}$ cm$^{-3}$. In this case, the element ratio and the element concentrations are within the ranges set by this embodiment.

In a case where the B concentration is $4 \times 10^{17}$ cm$^{-3}$, the P concentration is $1 \times 10^{17}$ cm$^{-3}$, and the N concentration is $1 \times 10^{17}$ cm$^{-3}$, for example, attention is paid only to B and P, which forms the second combination. As a result, P/B is 0.25, which does not satisfy the element ratio condition, and the element ratio is outside the range set by this embodiment.

Also, in a case where the Al concentration is $5 \times 10^{15}$ cm$^{-3}$, the B concentration is $5 \times 10^{15}$ cm$^{-3}$, the N concentration is $2.5 \times 10^{15}$ cm$^{-3}$, and the P concentration is $2.5 \times 10^{15}$ cm$^{-3}$, N/Al is 0.5, which satisfies the ratio condition, but the Al concentration is lower than $1 \times 10^{16}$ cm$^{-3}$ in the first combination. In the second combination, P/B is 0.5, which satisfies the ratio condition, but the B concentration is lower than $1 \times 10^{16}$ cm$^{-3}$. Therefore, either of the first and second combinations does not satisfy the desirable element concentration condition.

It should be noted that this embodiment does not exclude elements other than the above mentioned elements as p-type impurities and n-type impurities. In the following, an example case where the element A is Al (aluminum) and the element D is N (nitrogen) is described.

A surface region 19 is formed in part of the surface of the p-type second SiC epitaxial layer (the p-well region) 16. The surface region 19 and the p-well region 16 located there under function as the channel region. The surface region 19 is also formed with an epitaxial layer.

In the surface region 19, the concentration of the element A as the p-type impurity is lower than that in the p-well region 16. The ratio of the concentration of the element D as the n-type impurity to the concentration of the element A in the above combination is higher than that in the p-well region 16. That is, the surface region 19 has a lower p-type impurity concentration than that in the p-well region 16, and the proportion of the n-type impurity to the p-type impurity is higher than that in the p-well region 16.

As the impurity concentrations in the surface region 19 are lowered, the threshold value of the MOSFET 100 is adjusted, and the depth of the channel through which electrons flow is increased. Accordingly, electron scattering in the gate insulating film 28 and the semiconductor interface is reduced, and the mobility of electrons is improved. The impurity concentrations of the p-type impurity and the n-type impurity in the surface region 19 are not higher than $5\times10^{15}$ cm$^{-3}$, for example. The concentrations of the p-type impurity and the n-type impurity are preferably not higher than $1\times10^{15}$ cm$^{-3}$.

The depth of the surface region 19 is not greater than 100 nm, or preferably not greater than 50 nm, or more preferably not greater than 10 nm. If the depth becomes greater than that, the channel region becomes too deep, and controlling the threshold value in a stable manner might become difficult.

The ratio of the n-type impurity to the p-type impurity is increased to approximate 1:1, so that the surface region 19 becomes similar to an intrinsic (i-type) region, and the crystal strain in the channel portion is reduced. As a result, the decrease in the mobility due to crystal strain is reduced. So as to reduce the crystal strain, the ratio of the concentration of the element D to the concentration of the element A in the above combination(s) is preferably not lower than 0.9 and not higher than 1.1, or more preferably not lower than 0.95 and not higher than 1.05.

The impurity concentrations of the p-type impurity and the n-type impurity in the surface region 19 are preferably not higher than $5\times10^{15}$ cm$^{-3}$, or more preferably not higher than $1\times10^{15}$ cm$^{-3}$, for example. This is because the crystal strain will be reduced, and it will be easy to control the ratio between the p-type impurity and the n-type impurity to approximate 1:1.

As the surface region 19 becomes similar to an intrinsic (i-type) region, the surface region 19 can be substantially regarded as an insulating film. Accordingly, the channel through which electrons flow are physically separated from the interface between SiC and the gate insulating film 28, and the mobility becomes higher.

Where the gate insulating film 28 is an SiO$_2$ film, for example, the dielectric constant of i-type SiC is higher than that of the SiO$_2$ film. Accordingly, it is possible to assume that there is a gate insulating film having a stack structure formed with an SiO$_2$ film and a high-dielectric-constant film (a high-k insulating film).

As a high-dielectric-constant film is actually included, charges can be easily induced in the channel. As a high-dielectric-constant film is actually included, the electric field applied to the gate insulating film 28 is reduced, and the gate insulating film 28 has a higher resistance to breakage. Also, as a high-dielectric-constant film is actually included, the thickness of the gate insulating film 28 can be reduced.

An n$^-$-type first SiC region (a JFET region) 17 containing an n-type impurity at an impurity concentration of $5\times10^{15}$ to $1\times10^{19}$ cm$^{-3}$, for example, is formed in part of the surface of the p-type second SiC epitaxial layer (the p-well region) 16. The depth of the JFET region 17 is equal to or greater than the thickness of the p-well region 16. The JFET region 17 is connected to the n$^-$-SiC layer 14. The JFET region 17 functions as a transfer path for electrons serving as carriers.

An n$^+$-type second SiC region (a source region) 18 containing an n-type impurity at an impurity concentration of $1\times10^{18}$ to $1\times10^{22}$ cm$^{-3}$, for example, is formed in part of the surface of the p-type second SiC epitaxial layer (the p-well region) 16. The depth of the source region 18 is smaller than the thickness of the p-well region 16, and is approximately 0.3 μm, for example. The source region 18 is located at a distance from the JFET region 17, with the p-well region 16 being located in between.

A p$^+$-type third SiC region (a p-well contact region) 20 containing the p-type impurity at an impurity concentration of $1\times10^{18}$ to $1\times10^{22}$ cm$^{-3}$ is also formed in part of the surface of the p-well region 16 and on a side of the source region 18. The depth of the p-well contact region 20 is smaller than the thickness of the p-well region 16, and is approximately 0.3 μm, for example.

A gate insulating film 28 is continuously formed in the surfaces of the JFET region 17 and the surface region 19, so as to extend across those regions. The gate insulating film 28 may be an SiO$_2$ film or a high-k insulating film, for example.

A gate electrode 30 is formed on the gate insulating film 28. The gate electrode 30 may be made of polysilicon, for example. An interlayer insulating film 32 formed with an SiO$_2$ film, for example, is formed on the gate electrode 30.

The surface region 19 and the p-well region 16 thereunder, which are interposed between the source region 18 and the JFET region 17 under the gate electrode, function as the channel region of the MOSFET 100.

A conductive first electrode (a source/p-well common electrode) 24 that is electrically connected to the source region 18 and the p-well contact region 20 is provided. The first electrode (the source/p-well common electrode) 24 is formed with a Ni (nickel) barrier metal layer 24a and an Al metal layer 24b formed on the barrier metal layer 24a, for example. The Ni barrier metal layer 24a and the Al metal layer 24b may form an alloy through a reaction.

A conductive second electrode (a drain electrode) 36 is formed on the side of the second plane of the SiC substrate 12. The second electrode (the drain electrode) 36 is made of Ni, for example.

In this embodiment, the n-type impurity is preferably N (nitrogen) or P (phosphorus), for example, but it is possible to use As (arsenic) or the like. Also, the p-type impurity is preferably Al (aluminum), for example, but it is possible to use B (boron), Ga (gallium), In (indium), or the like.

Next, a method of manufacturing the semiconductor device of this embodiment is described.

A method of manufacturing the semiconductor device of this embodiment includes: forming an n-type first SiC epitaxial layer by an epitaxial growth technique; forming a p-type second SiC epitaxial layer on the first SiC epitaxial layer by an epitaxial growth technique, supplies of a source gas of a p-type impurity and a source gas of an n-type impurity being controlled, the p-type impurity being an element A, the n-type impurity being an element D, the element A and the element D forming a combination of Al (aluminum), Ga (gallium), or In (indium) and N (nitrogen), and/or a combination of B (boron) and P (phosphorus), the ratio of the concentration of the element D to the concentration of the element A in the combination(s) being higher than 0.33 but lower than 1.0; forming an n-type first SiC region in the surface of the second SiC epitaxial layer by n-type impurity ion implantation, the n-type first SiC region having a depth that is equal to or greater than the thickness of the second SiC epitaxial layer; forming an n-type second SiC region at a distance from the n-type first SiC region in the surface of the second SiC epitaxial layer by n-type impurity ion implantation, the n-type second SiC region having a depth that is smaller than the thickness of the second SiC epitaxial layer; forming a gate insulating film in the surface of the second SiC epitaxial layer; forming a gate electrode on the gate insulating film; forming a first electrode on the second SiC region; and forming a second electrode on the opposite side of the first SiC epitaxial layer from the first electrode. In the upper portion of the second SiC epitaxial layer, the supply of the source gas of the p-type impurity is reduced, for example, to form a surface region that has the element A at a lower concentration than that in the lower portion, and a higher ratio of the concentration of the element D to the concentration of the element A in the combination(s).

Figure 2:
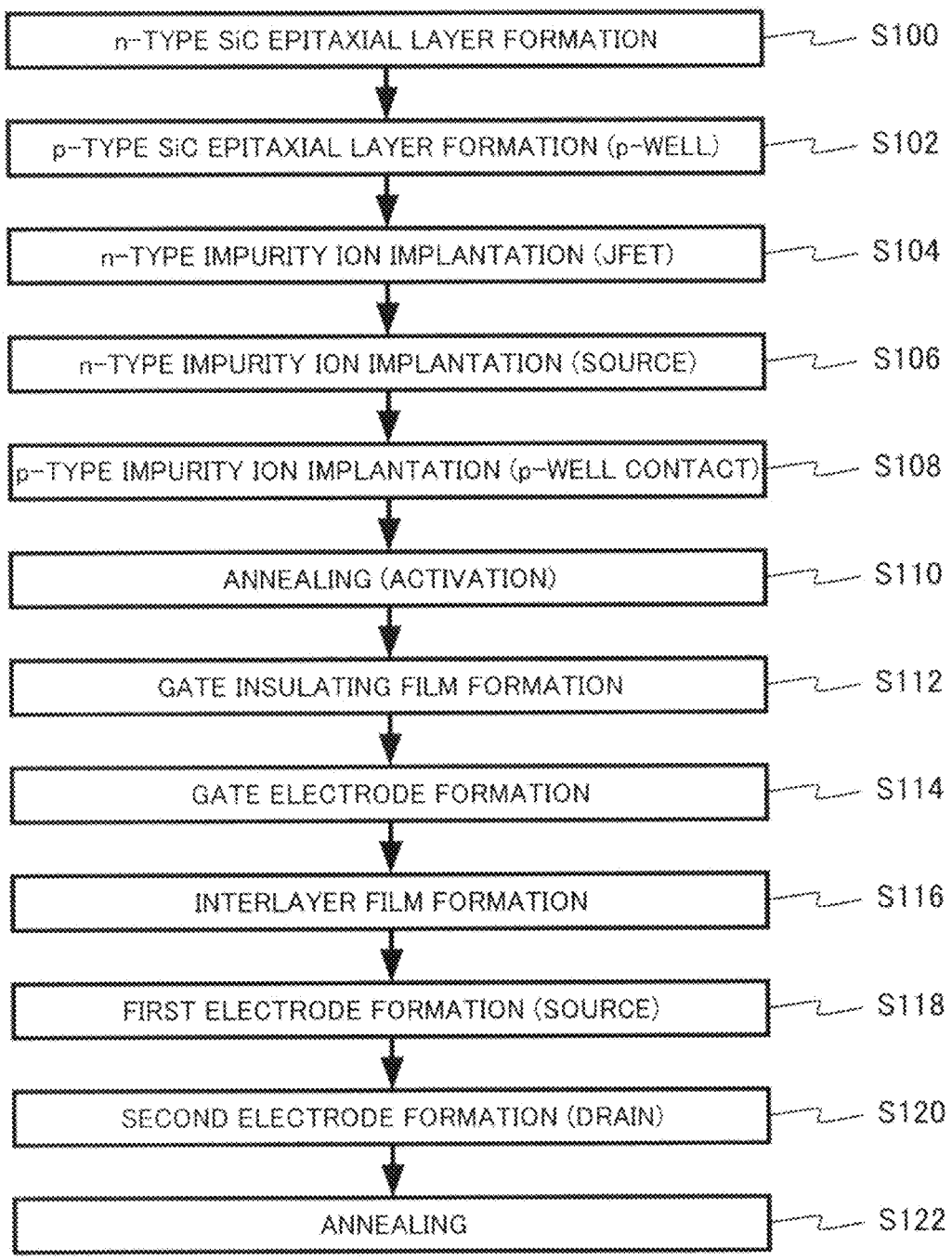
FIG. 2 is a process flowchart showing a method of manufacturing the semiconductor device of the first embodiment.

FIG. 2 is a process flowchart showing an example of the method of manufacturing the semiconductor device of this embodiment. FIGS. 3 through 8 are schematic cross-sectional views illustrating the method of manufacturing the semiconductor device of this embodiment.

As shown in FIG. 2, the method of manufacturing the semiconductor device includes n⁻-type SiC epitaxial layer formation (step S100), p-type SiC epitaxial layer formation (step S102), n-type impurity ion implantation (step S104), n-type impurity ion implantation (step S106), p-type impurity ion implantation (step S108), annealing (step S110), gate insulating film formation (step S112), gate electrode formation (step S114), interlayer film formation (step S116), first electrode formation (step S118), second electrode formation (step S120), and annealing (step S122).

First, the n-type SiC substrate 12 that contains P (phosphorus) or N (nitrogen) as the n-type impurity at an impurity concentration of approximately $5 \times 10^{18}$ cm$^{-3}$, has a thickness of 300 μm, for example, and has a low resistance of 4H—SiC, is prepared.

Figure 3:
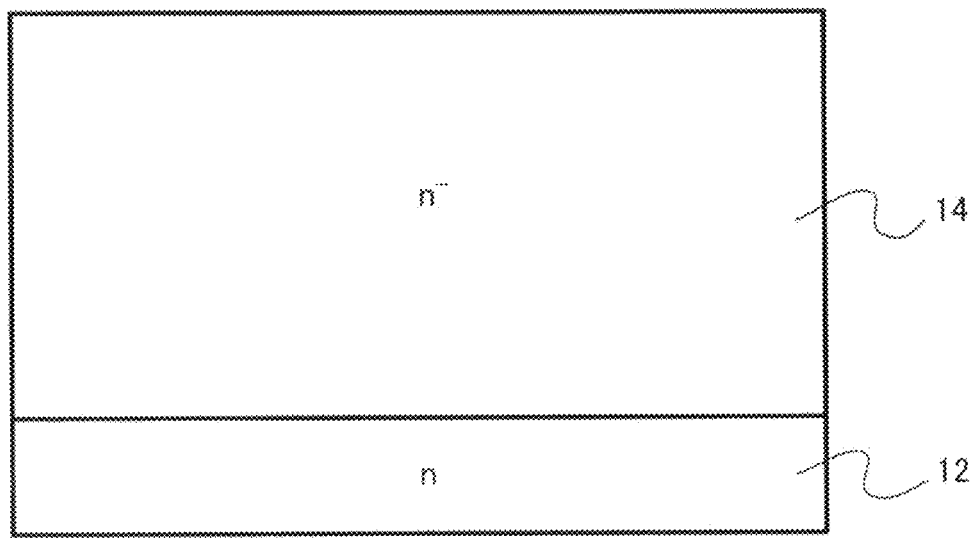
FIG. 3 is a schematic cross-sectional view illustrating the method of manufacturing the semiconductor device of the first embodiment.

In step S100, the high-resistance n-type first SiC epitaxial layer (the n⁻-SiC layer) 14 that contains N as the n-type impurity at an impurity concentration of approximately $1 \times 10^{16}$ cm$^{-3}$, for example, and has a thickness of approximately 10 μm is epitaxially grown on one of the planes of the SiC substrate 12 by an epitaxial growth technique (FIG. 3).

Figure 4:
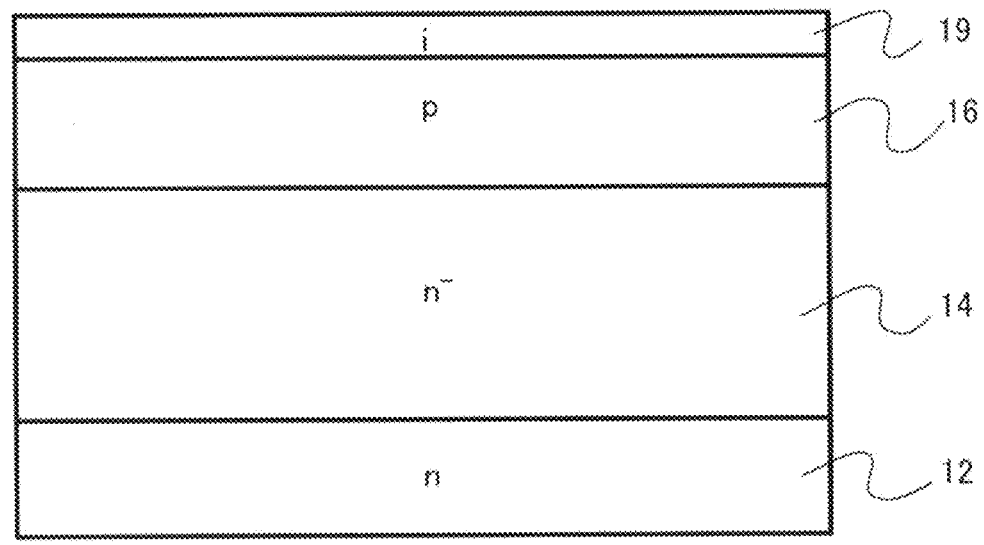
FIG. 4 is a schematic cross-sectional view illustrating the method of manufacturing the semiconductor device of the first embodiment.

In step S102, the p-type second SiC epitaxial layer (the p-well region) 16 is formed on the n⁻-SiC layer 14 by an epitaxial growth technique (FIG. 4). The p-type second SiC epitaxial layer (the p-well region) 16 contains a p-type impurity and an n-type impurity.

When the p-type second SiC epitaxial layer (the p-well region) 16 is grown, a source gas of Si (silicon), a source gas of C (carbon), a source gas of the n-type impurity, and a source gas of the p-type impurity are simultaneously supplied, to epitaxially grow p-type SiC. Where the p-type impurity is an element A and the n-type impurity is an element D, the element A and the element D form a combination of Al (aluminum), Ga (gallium), or In (indium) and N (nitrogen), and/or a combination of B (boron) and P (phosphorus). The supply amounts (flow rates) of the p-type impurity source gas and the n-type impurity source gas are controlled so that the ratio of the concentration of the element D to the concentration of the element A in the combination (s) in the p-type SiC being grown becomes higher than 0.33 but lower than 1.0. With this arrangement, the ratio of the concentration of the element D to the concentration of the element A in the above combination(s) is higher than 0.33 but lower than 1.0. The p-type second SiC epitaxial layer (the p-well region) 16 contains Al as the p-type impurity, and N as the n-type impurity, for example.

While the p-type second SiC epitaxial layer (the p-well region) 16 is being grown, the supply of the source gas of the p-type impurity is reduced, for example, to form the surface region 19. The surface region 19 contains the element A at a lower concentration than that in the second SiC epitaxial layer (the p-well region) 16 thereunder, and has a higher ratio of the concentration of the element D to the concentration of the element A in the above combination (s) than that in the second SiC epitaxial layer. Growth conditions such as the supply amounts of the source gases are preferably controlled so that the ratio of the concentration of the element D to the concentration of the element A in the surface region 19 becomes not lower than 0.9 and not higher than 1.1.

Figure 5:
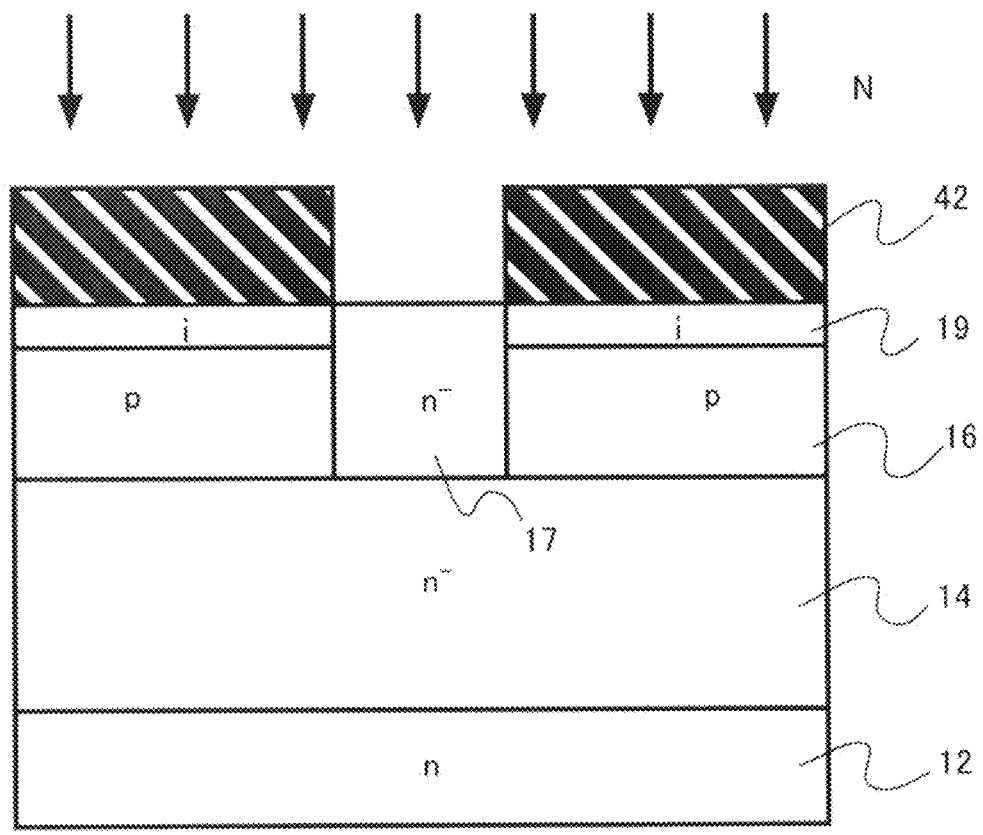
FIG. 5 is a schematic cross-sectional view illustrating the method of manufacturing the semiconductor device of the first embodiment.

After that, patterning is performed by photolithography and etching, to form a first mask material 42 that is made of SiO₂, for example. In step S104, with the first mask material 42 being used as an ion implantation mask, N as the n-type impurity is implanted into the p-type second SiC epitaxial layer (the p-well region) 16 through ion implantation, to form the n-type first SiC region (the JFET region) 17 (FIG. 5).

That is, the n-type impurity at a higher concentration than the p-type impurity concentration in the p-well region 16 are implanted through ion implantation, to switch the conductivity types. The accelerating energy and the dose amount in the ion implantation are adjusted so that the depth of the first SiC region (the JFET region) 17 becomes equal to or greater than the thickness of the second SiC epitaxial layer.

Figure 6:
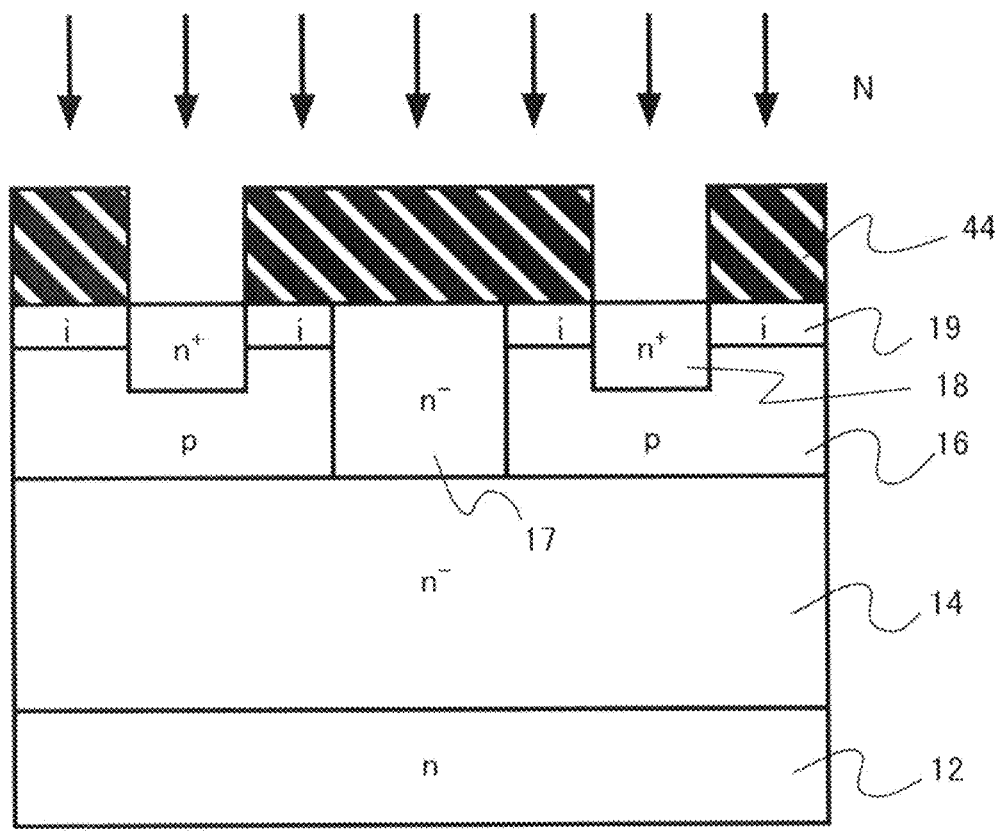
FIG. 6 is a schematic cross-sectional view illustrating the method of manufacturing the semiconductor device of the first embodiment.

After that, patterning is performed by photolithography and etching, to form a second mask material 44 that is made of SiO₂, for example. In step S106, N as the n-type impurity is implanted into the p-well region 16 through ion implantation by using the second mask material 44 as an ion implantation mask, to form the second SiC region (the source region) 18 (FIG. 6). The accelerating energy and the dose amount in the ion implantation are adjusted so that the depth of the second SiC region (the source region) 18 becomes smaller than the thickness of the second SiC epitaxial layer.

Figure 7:
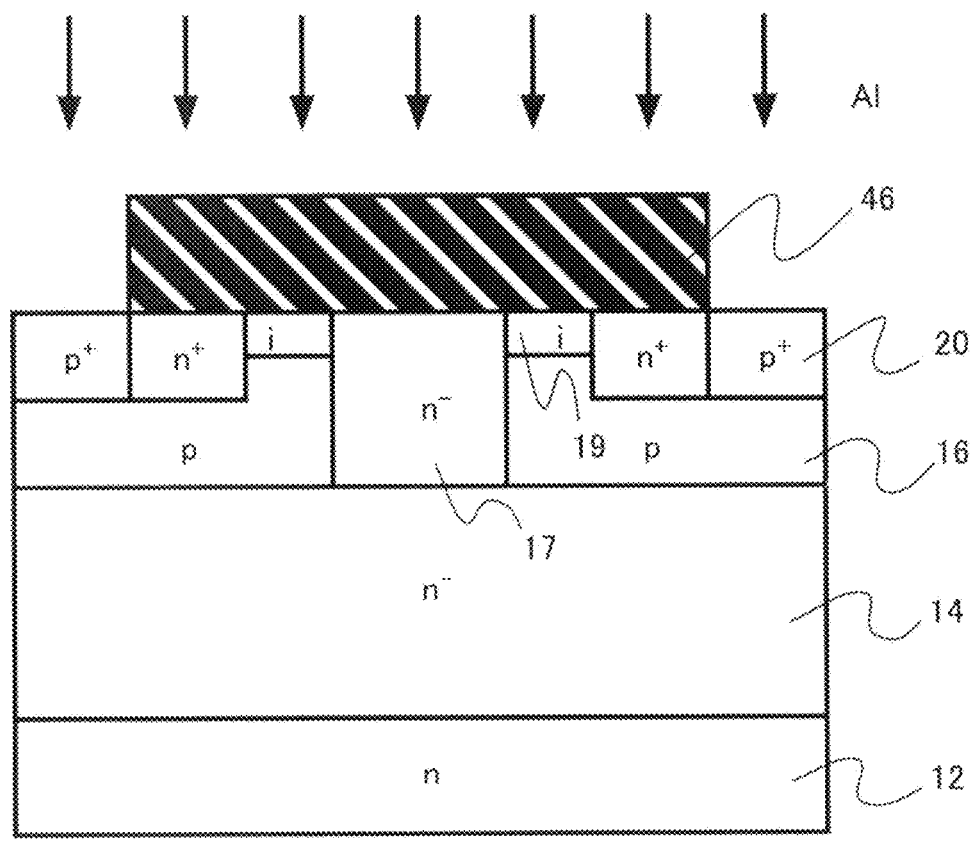
FIG. 7 is a schematic cross-sectional view illustrating the method of manufacturing the semiconductor device of the first embodiment.

After that, patterning is performed by photolithography and etching, to form a third mask material 46 that is made of SiO₂, for example. In step S108, Al as the p-type impurity is implanted into the p-well region 16 through ion implantation by using the third mask material 46 as an ion implantation mask, to form the third SiC region (the p-well contact region) 20 (FIG. 7). The accelerating energy and the dose amount in the ion implantation are adjusted so that the depth of the third SiC region (the p-well contact region) 20 becomes smaller than the thickness of the second SiC epitaxial layer.

In step S110, after the p-well contact region 20 is formed, annealing for activation is performed. The conditions for the annealing are that an argon (Ar) gas is used as the atmosphere gas, the heating temperature is 1600° C., and the heating period is 30 minutes, for example. At this point, the impurities implanted into the SiC can be activated, but diffusion is small.

Figure 8:
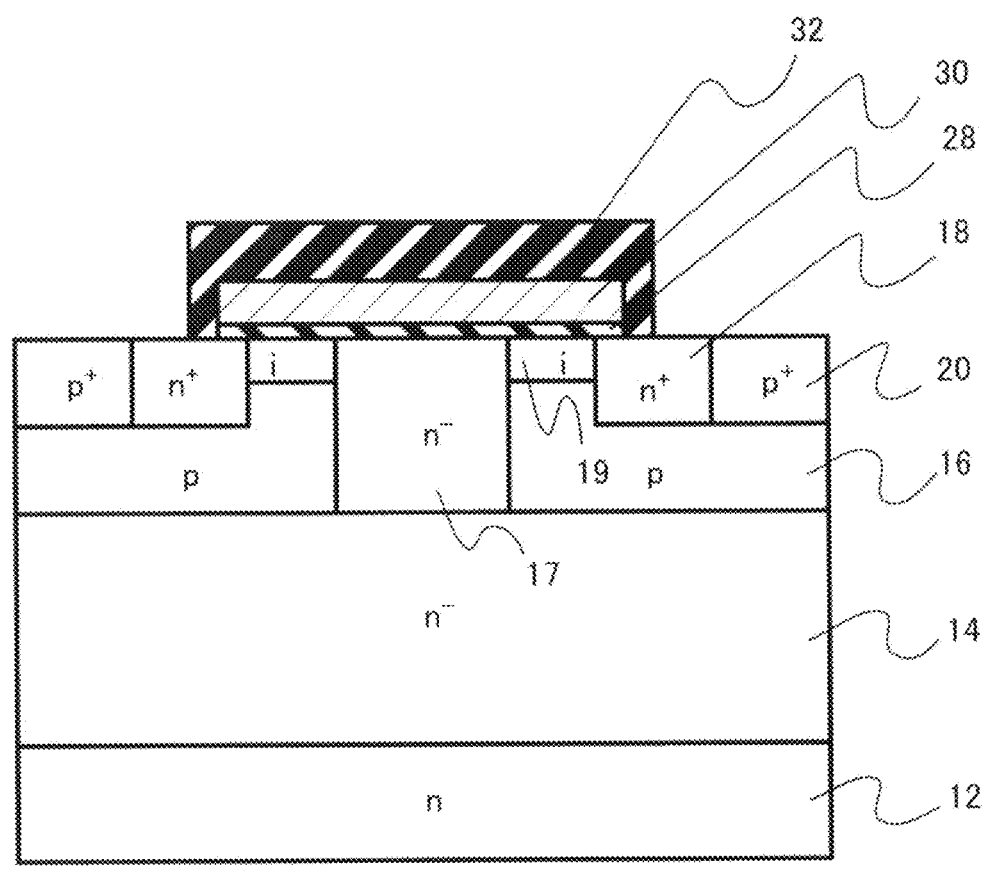
FIG. 8 is a schematic cross-sectional view illustrating the method of manufacturing the semiconductor device of the first embodiment.

In step S112, the gate insulating film 28 that is formed with an SiO₂ film, for example, is formed by CVD (Chemical Vapor Deposition) or thermal oxidation. In step S114, the gate electrode 30 that is made of polysilicon, for example, is formed on the gate insulating film 28. In step S116, the interlayer insulating film 32 that is formed with an SiO₂ film, for example, is formed on the gate electrode 30 (FIG. 8).

In step S118, the conductive first electrode (the source/p-well common electrode) 24 that is electrically connected to the source region 18 and the p-well contact region 20 is formed. The first electrode (the source/p-well common electrode) 24 is formed by Ni (nickel) and Al sputtering, for example.

In step S120, the conductive second electrode (the drain electrode) 36 is formed on the side of the second plane of the n⁻SiC substrate 12. The second electrode (the drain electrode) 36 is formed by Ni sputtering, for example.

In step S122, annealing at a low temperature is performed to lower the contact resistance between the first electrode 24 and the second electrode 36. The annealing is performed in an argon gas atmosphere at 400° C., for example.

By the above described manufacturing method, the MOSFET 100 shown in FIG. 1 is formed.

In the following, the function and effects of this embodiment are described in detail.

It has become apparent from the results of studies made by the inventors that pairing between Al and N can be caused by co-doping SiC with Al as the p-type impurity (p-type dopant) and N as the n-type impurity (n-type dopant). In this pairing state, carrier compensation occurs, and a zero-carrier state is formed.

Figure 9:
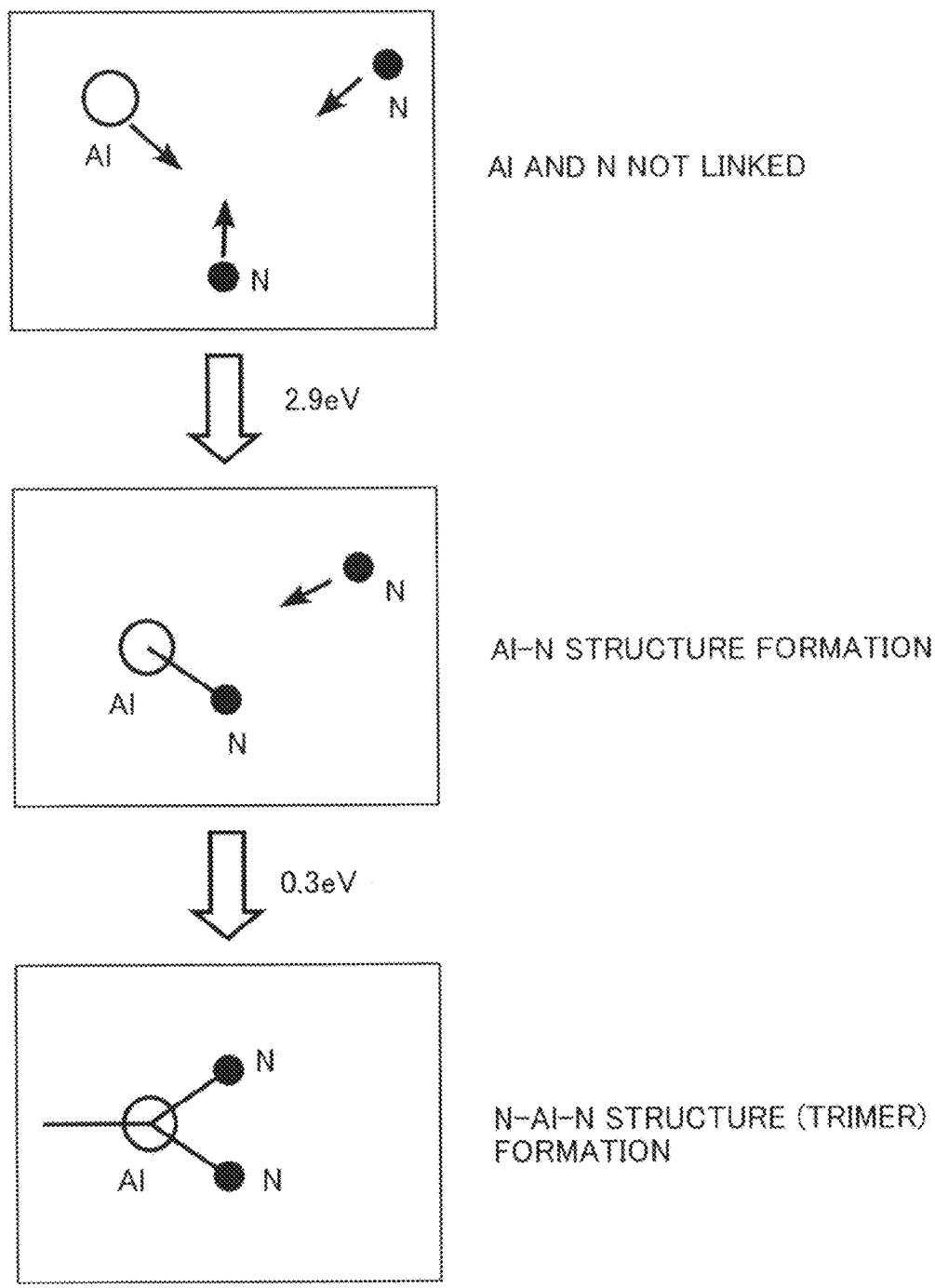
FIG. 9 is a diagram for explaining the function of co-doping.
Figure 10:
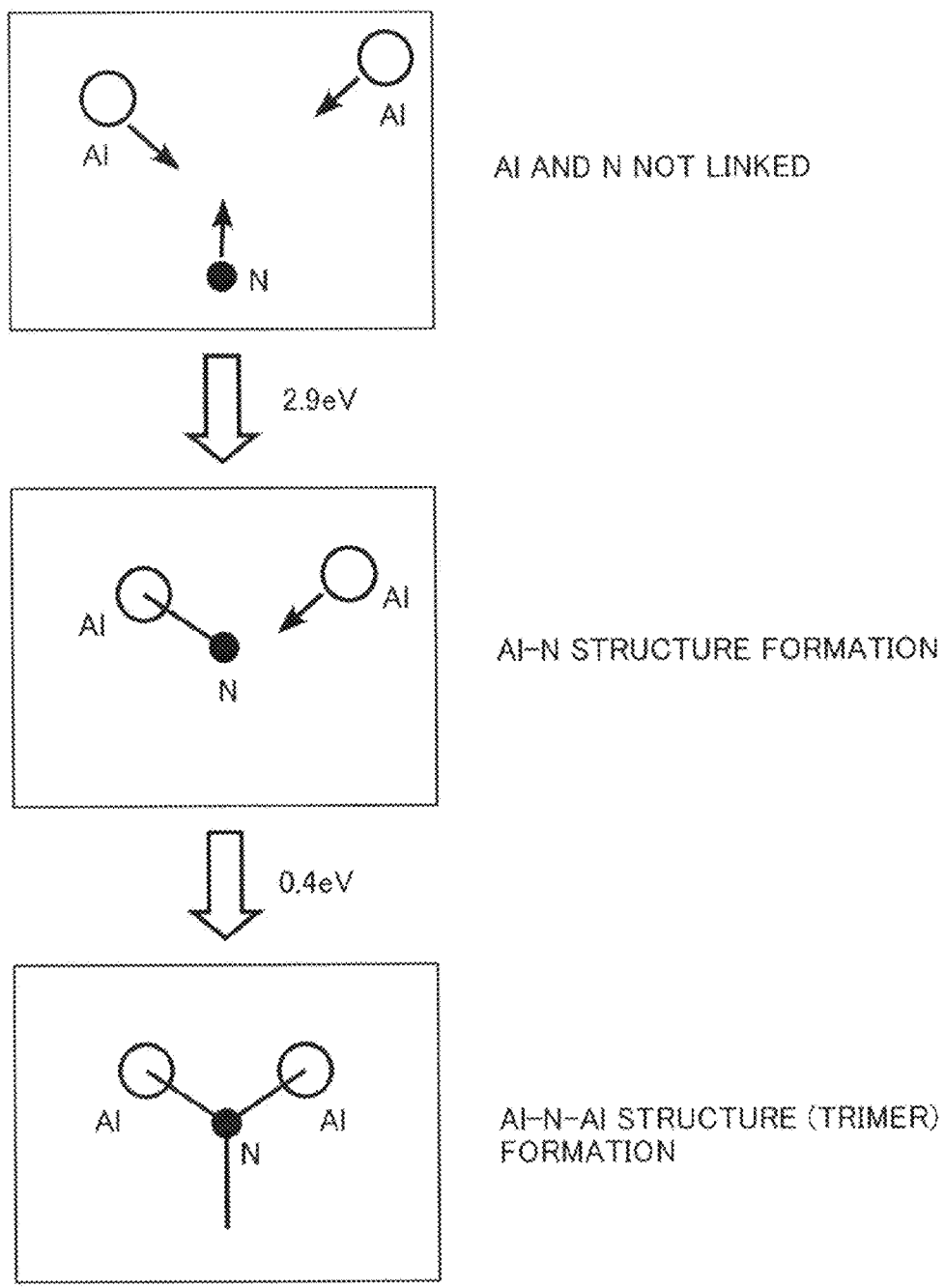
FIG. 10 is a diagram for explaining the function of co-doping.

FIGS. 9 and 10 are diagrams for explaining the function of co-doping. FIG. 9 shows the case of n-type SiC, and FIG. 10 shows the case of p-type SiC. It has become apparent from the first principle calculation performed by the inventors that Al enters Si (silicon) sites and N enters C (carbon) sites in SiC so that Al and N become adjacent to each other, and, as a result, the system becomes stable.

Specifically, as shown in FIGS. 9 and 10, where Al and N are linked to each other to form Al—N pair structures, the system becomes 2.9 eV more stable in terms of energy than a system in which Al and N are not linked to each other but exist independently of each other. If the Al amount and the N amount are the same, the most stable state is achieved when all of the two elements form pair structures.

Here, the first principle calculation is a calculation using ultrasoft pseudopotential. Ultrasoft pseudopotential is a type of pseudopotential, and was developed by Vanderbilt et al. For example, a lattice constant has such a high precision as to realize experimental values with a margin of error of 1% or less. Structural relaxation is achieved by introducing impurities (dopant), and the entire energy of a stable state is calculated. The energy of the entire system after a change is compared with the energy prior to the change, so as to determine which structures are in a stable state. In a stable state, in which energy positions impurity levels are located in the band gap can be indicated.

As shown in FIG. 9, it has become apparent that, in a case where the amount of N is larger than the amount of Al, or in the case of n-type SiC, extra N enters C sites located in the vicinities of Al—N pair structures, to form N—Al—N trimers and further stabilize the system. According to the first principle calculation, trimers are formed, and the system becomes 0.3 eV more stable than a system in which pair structures exist separately from N.

Likewise, as shown in FIG. 10, it has become apparent that, in a case where the amount of Al is larger than the amount of N, or in the case of p-type SiC, extra Al enters Si sites located in the vicinities of Al—N pair structures, to form Al—N—Al trimers and further stabilize the system. According to the first principle calculation, trimers are formed, and the system becomes 0.4 eV more stable than a system in which Al—N pair structures exist separately from Al.

Next, dopant combinations other than the combination of Al and N are discussed. Calculation results obtained in a case where a calculation was conducted for a combination of B (boron) and N (nitrogen) are described below.

B enters Si sites, and N enters C sites. According to the first principle calculation, B—N—B or N—B—N trimeric structures cannot be formed. Specifically, B—N pair structures are formed, but the energy of the system becomes higher when B or N approaches the B—N pair structures. Accordingly, the system is more stable in terms of energy when extra B or N exists in positions sufficiently away from the pair structures.

According to the first principle calculation, when extra B forms trimers, the energy of the system is 0.5 eV higher than that in a case where B—N pairs exist independently of B. Also, when extra N forms trimers, the energy of the system is 0.3 eV higher than that in a case where B—N pairs exist independently of N. Therefore, in either case, the system becomes unstable in terms of energy when trimers are formed.

Figure 11:
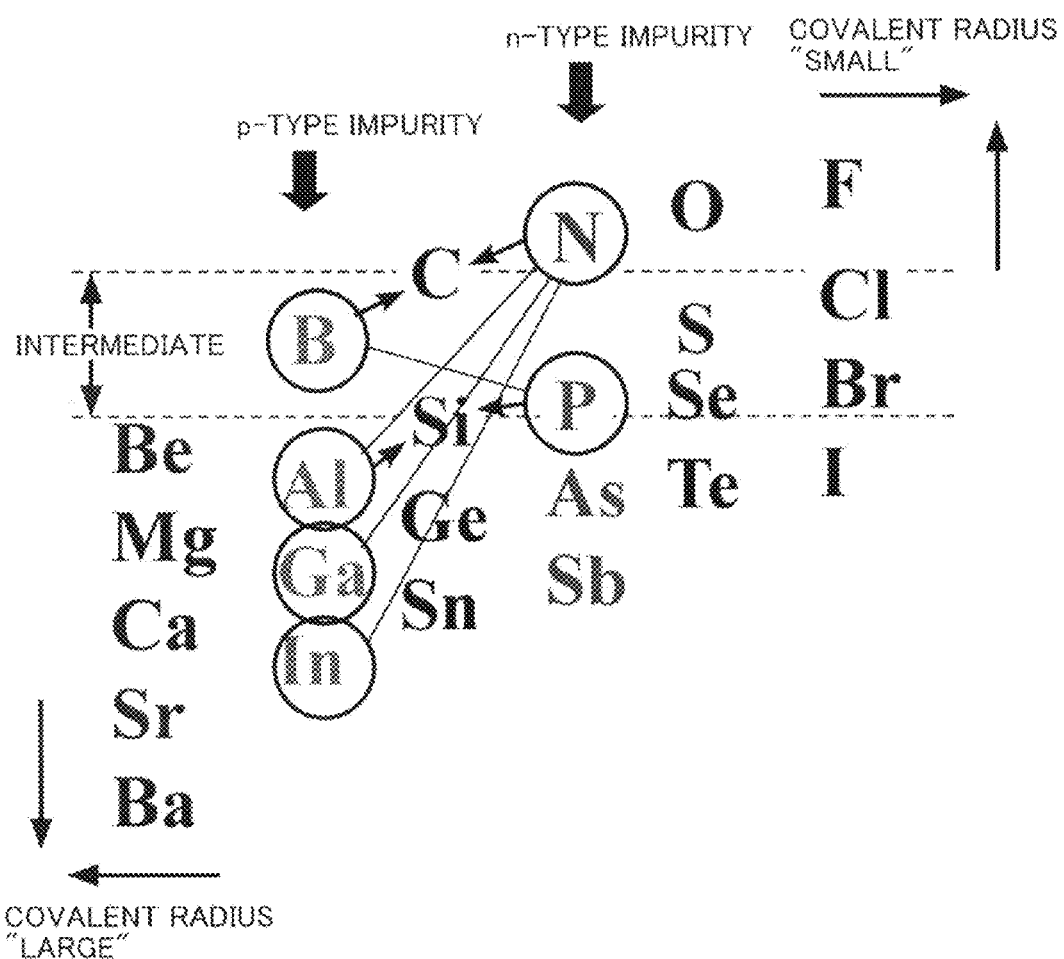
FIG. 11 is a diagram for explaining the function of co-doping.

FIG. 11 is a diagram for explaining the function of co-doping. FIG. 11 shows the covalent radii of respective elements. Elements with smaller covalent radii are shown in the upper right portion in the drawing, and elements with larger covalent radii are shown in the lower left portion.

Considering the covalent radii, it is understandable that the system becomes unstable when trimers are formed with B and N. The covalent radius of B is smaller than the covalent radius of Si, and the covalent radius of N is smaller than the covalent radius of C. Therefore, when B enters Si sites and N enters C sites, strain accumulates, and trimers cannot be formed.

It has become apparent that trimers are not formed with combinations of the p-type impurity and the n-type impurity as dopant other than the combinations of "an element (Al, Ga, or In) having a larger covalent radius than Si" and "an element (N) having a smaller covalent radius than C", and the reverse combination of "an element (B) having a larger covalent radius than C" and "an element (P) having a smaller covalent radius than Si".

Since the covalent radii of B and P are between the covalent radius of Si and the covalent radius of C, B and P can enter both Si sites and C sites. However, the other impurities (Al, Ga, In, N, and As) basically enter either Si sites or C sites. It is safe to say that Al, Ga, In, and As enter Si sites, and N enters C sites.

Furthermore, when both impurities enter Si sites or both impurities enter C sites, there is no need to take into account such an aspect. This is because it is difficult to relax strain unless the p-type impurity and the n-type impurity are located at the closest distance from each other. Therefore, where the p-type impurity is the element A and the n-type impurity is the element D, it is difficult to form trimers with combinations of the element A and the element D other than the four combinations of "Al and N", "Ga and N", "In and N", and "B and P".

The pair structures or the trimeric structures cannot be formed unless there is interaction between atoms. If approximately 10 unit cells exist in the c-axis direction, the interaction is invisible, and the impurity levels (dopant levels) in a 4H—SiC structure according to the first principle calculation are in a flat state. That is, diffusion is sufficiently restrained, and is on the order of approximately 10 meV.

In other words, it is considered that there is little interaction when the distance between impurities is 10 nm or longer. In view of this, to maintain interaction between impurities, the impurity concentrations are preferably $1 \times 10^{18}$ $cm^{-3}$ or higher.

This value is the lower limit of impurity concentrations that is desired when a local impurity distribution is formed through ion implantation in a case where a SiC material has already been formed.

To cause an effect of co-doping to appear in semiconductor SiC, the ratio between the n-type impurity concentration and the p-type impurity concentration needs to be restricted within a specific range. By the later described manufacturing method, it is critical that the ratio between the n-type and p-type impurities to be introduced by ion implantation be set at a ratio within the specific range from the start. Although the reach of interaction is as short as less than 10 nm, trimers can be formed by virtue of the attraction force of each other within the range. Furthermore, as the attraction force is applied, the temperature of the activating anneal for the impurities can be lowered from 1700-1900° C., which is the temperature range in a case where co-doping is not performed, to 1500-1800° C.

However, the impurity concentration desirable for trimer formation can be lowered in crystal growth from a vapor phase by CVD (Chemical Vapor Deposition) or the like. This is because raw material can be made to flow in the surface, and accordingly, interaction between the impurities can easily occur at low concentrations.

In vapor phase growth, the region of impurity concentrations for trimer formation is $1\times10^{15}$ cm$^{-3}$ to $1\times10^{22}$ cm$^{-3}$, which is wider than that with ion implantation. In vapor phase growth, it is possible to lower the impurity concentration in SiC to approximately $1\times10^{16}$ cm$^{-3}$ or increase the impurity concentration in SiC to approximately $1\times10^{21}$ cm$^{-3}$, for example. Particularly, it is difficult to form a low-concentration region through ion implantation. Therefore, impurity region formation through vapor phase growth is particularly effective in a low-concentration region. Furthermore, it is possible to form a co-doped film as thin as 5 nm, for example, through vapor phase growth.

Vapor phase growth also has the advantage that defects in crystals are not easily formed in regions containing impurities at high concentrations. In the case of ion implantation, defects in crystals increase as the amount of introduced impurities becomes larger, and recovery through a heat treatment or the like also becomes difficult. By vapor phase growth, trimers are formed during the growth, and defects due to impurity implantation are hardly formed. In view of this, impurity region formation through vapor phase growth is effective in regions having impurity concentrations of $1\times10^{19}$ cm$^{-3}$ or higher, or more preferably, $1\times10^{20}$ cm$^{-3}$ or higher, for example.

As described above, vapor phase growth has effects that cannot be achieved by ion implantation. However, impurity regions that are locally co-doped can be formed through ion implantation. Also, co-doped impurity regions can be formed at low costs. Therefore, either vapor phase growth or ion implantation should be used where appropriate.

When trimers are to be formed at the time of crystal growth from a vapor phase, the concentrations of the p-type and n-type impurities are preferably $1\times10^{15}$ cm$^{-3}$ or higher. Further, so as to facilitate the trimer formation, the impurity concentrations are preferably $1\times10^{16}$ cm$^{-3}$ or higher.

When trimers are formed, the upper limit of impurity concentrations may exceed the solid solubility limit of cases where trimers are not formed. This is because, when trimers are formed, strain in crystals is relaxed, and the impurities are easily solved.

The impurity solid solubility limit in a case where trimers are not formed is on the order of $10^{19}$ cm$^{-3}$ in the case of N, and is on the order of $10^{21}$ cm$^{-3}$ even in the case of Al. As for the other impurities, the solid solubility limit is on the order of approximately $10^{21}$ cm$^{-3}$.

When only one type of impurity is used, the size of the impurity is either small or large. Therefore, strain accumulates, and the impurity cannot easily enter lattice points. As a result, activation cannot be caused. Particularly, in the case of ion implantation, a large number of defects are formed, and the solid solubility limit becomes even lower.

However, when trimers are formed, both Al and N can be implanted up to the order of approximately $10^{22}$ cm$^{-3}$. As strain can be relaxed by forming trimers with one of the four combinations of "Al and N", "Ga and N", "In and N", and "B and P", the solid solubility limit can be extended. As a result, the impurity solid solubility limit can be extended to the order of $10^{22}$ cm$^{-3}$.

In a case where the impurity is B, Al, Ga, In, or P, strain is large, and a large number of defects exist, if the impurity concentration is $1\times10^{20}$ cm$^{-3}$ or higher, or more particularly, $6\times10^{20}$ cm$^{-3}$ or higher. As a result, sheet resistance or resistivity becomes very high.

However, co-doping with the p-type impurity and the n-type impurity can reduce defects even in regions having such high impurity concentrations.

When an impurity is N, the solid solubility limit is further lowered by one digit to approximately $2\times10^{19}$ cm$^{-3}$. According to the first principle calculation, this is probably because defects of inactive interstitial N are formed.

As trimers are formed, the upper limit of the N concentration is dramatically increased from the order of $10^{19}$ cm$^{-3}$ to the order of $10^{22}$ cm$^{-3}$. In a case where an n-type region doped at a high concentration is to be formed, nitrogen cannot be normally used, and P ions are implanted at approximately $10^{20}$ cm$^{-3}$, for example. In this embodiment, however, an n-type region doped at a high concentration can be formed by using nitrogen. For example, N is implanted at $2\times10^{20}$ cm$^{-3}$, and Al is implanted at $1\times10^{20}$ cm$^{-3}$. It is normally difficult to use nitrogen, but nitrogen can be used in this embodiment.

As described above, both the p-type impurity and the n-type impurity are implanted, and an appropriate combination of covalent radii is selected, so that trimers can be formed. The structures are then stabilized, and strain can be reduced.

As a result, (1) the respective impurities can easily enter lattice points, (2) the process temperature can be lowered, and a temperature decrease of at least 100° C. can be expected, (3) the amount of impurities that can be activated increases (the upper limit is extended), (4) stable structures such as trimers or pair structures can be formed, and entropy is increased and crystal defects are reduced with the structures, and (5) as the trimers are stable, revolutions around the bonds that bind the p-type impurity and the n-type impurity become difficult, and the structures are immobilized. Accordingly, energization breakdown tolerance becomes dramatically higher. For example, when trimeric structures are formed in at least one part of the p-type impurity region and the n-type impurity region of a pn junction, energization breakdown is restrained, and an increase in resistance can be avoided. As a result, a degradation phenomenon (Vf degradation) in which the voltage (Vf) required to be applied so as to apply a certain amount of current becomes higher can be restrained.

As described above, pairing between Al and N can be caused by co-doping with Al as the p-type impurity and N as the n-type impurity. Furthermore, it has become apparent from the first principle calculation that both acceptor levels and donor levels can be made shallower at this point.

Figure 12:
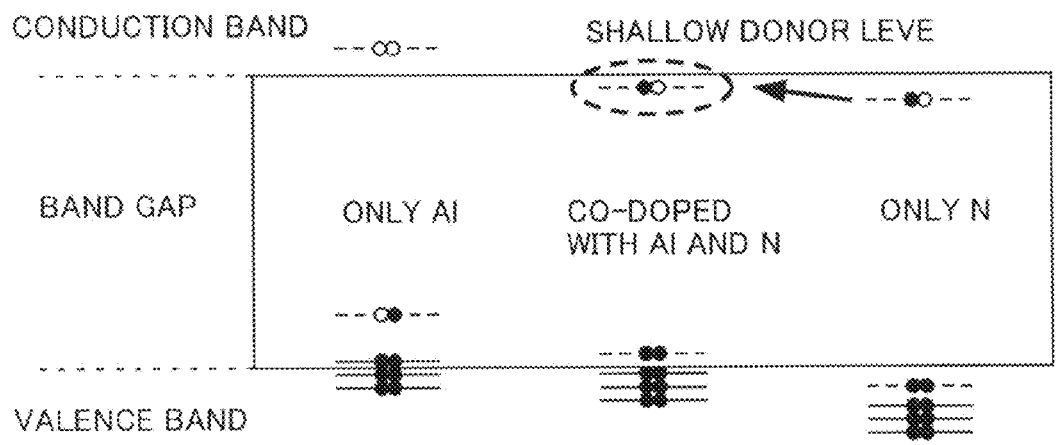
FIG. 12 is a diagram for explaining the function of co-doping.
Figure 13:
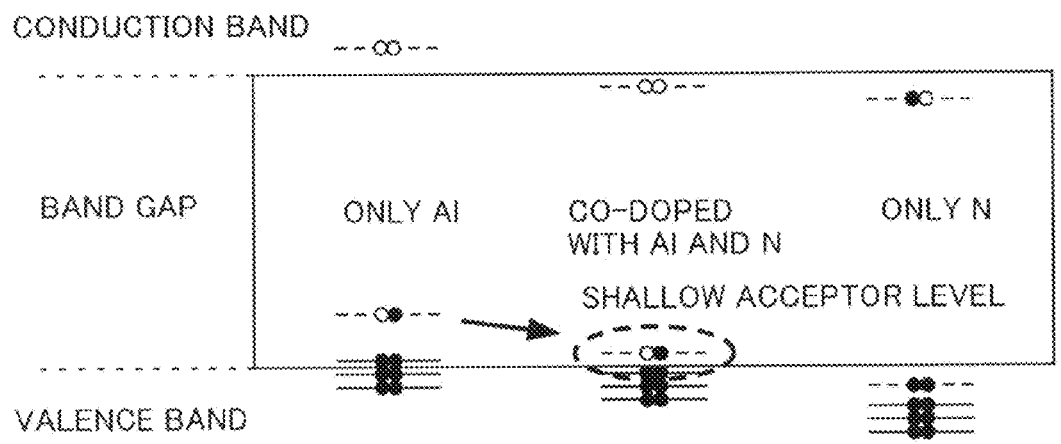
FIG. 13 is a diagram for explaining the function of co-doping.

FIGS. 12 and 13 are diagrams for explaining the function of co-doping. FIG. 12 shows the case of n-type SiC, and FIG. 13 shows the case of p-type SiC. White circles represent empty levels not filled with electrons, and black circles represent levels filled with electrons.

The reason that the donor levels become shallower is that the empty levels located within the conduction band of Al as the acceptor interact with the donor levels of N, and the donor levels are raised, as shown in FIG. 12. Likewise, the reason that the acceptor levels become shallower is that the levels that are filled with electrons and are located within the valence band of N as the donor interact with the acceptor levels of Al, and the acceptor levels are lowered, as shown in FIG. 13.

Normally, N or P (phosphorus) as the n-type impurity forms donor levels that are as deep as 42 meV to 95 meV. B, Al, Ga, or In as the p-type impurity forms very deep acceptor levels of 160 meV to 300 meV. If trimers are formed, on the other hand, the n-type impurity can form donor levels of 35 meV or lower, and the p-type impurity can form acceptor levels of 100 meV or lower.

In an optimum state where trimers are completely formed, n-type N or P forms levels of approximately 20 meV, and p-type B, Al, Ga, or In forms levels of approximately 40 meV. As such shallow levels are formed, most of the activated impurities turn into carriers (free electrons and free holes). Accordingly, the bulk resistance becomes one or more digits lower than that in a case where co-doping is not performed.

In the case of n-type SiC, the donor levels that contribute to carrier generation becomes 40 meV or lower, and as a result, the resistance becomes lower than that in a case where co-doping is not performed. Also, as the donor levels become 35 meV or lower, the resistance is lowered by approximately one digit. As the donor levels become 20 meV or lower, the resistance is lowered by approximately two digits. However, a strain relaxation effect and a doping upper limit extension effect are also achieved.

In the case of p-type SiC, the acceptor levels that contribute to carrier generation becomes 150 meV or lower, and as a result, the resistance becomes lower than that in a case where co-doping is not performed. Also, as the acceptor levels become 100 meV or lower, the resistance is lowered by approximately one digit. As the acceptor levels become 40 meV or lower, the resistance is lowered by approximately two digits. However, a strain relaxation effect and a doping upper limit extension effect are also achieved.

When the Al concentration and the N concentration are the same (N:Al=1:1), an insulator is formed, because there are no carriers though there are shallow levels. There exist carriers that are equivalent to a difference between the Al concentration and the N concentration. To form a low-resistance semiconductor, a concentration difference is required.

When the N concentration is higher than the Al concentration (N concentration >Al concentration), extra N generated as a result of formation of Al—N pairs through interaction is also stabilized by displacing C located in the vicinities of the Al—N pairs. Accordingly, shallow donor levels are formed. Also, strain is relaxed. Accordingly, the N concentration can be made higher than that in a case where trimers are not formed.

Figure 14:
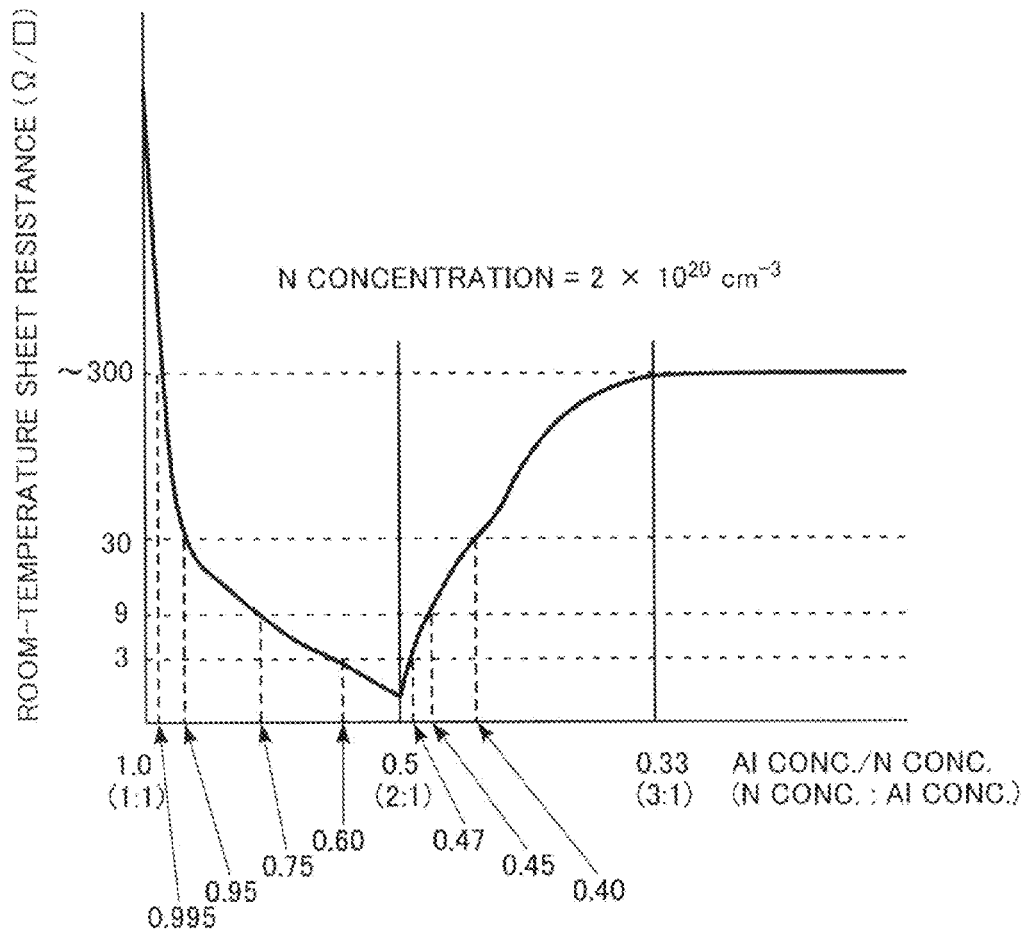
FIG. 14 is a diagram showing the relationship between Al and N concentrations and sheet resistance in the case of n-type SiC.

FIG. 14 is a diagram showing the relationship between Al and N concentrations and sheet resistance in the case of n-type SiC. The N concentration is $2\times10^{20}$ cm$^{-3}$. When only N is implanted, the sheet resistance cannot be lowered even if N is implanted at $1\times10^{19}$ cm$^{-3}$ or higher. The value is approximately 300Ω/□.

While "N concentration:Al concentration" is changing from 1:1 to 2:1, trimers are formed without strain, and the number of carrier electrons in the shallow donor levels increases. Accordingly, the sheet resistance rapidly decreases.

When the ratio reaches 2:1, the maximum amount of carriers is available, and the sheet resistance becomes lowest. As shown in FIG. 14, the sheet resistance can be lowered down to approximately 1.5Ω/□. The contact resistance to n-type SiC can also be lowered from approximately $10^{-5}$ Ωcm$^3$ to approximately $10^{-7}$ Ωcm$^3$ by making "N concentration:Al concentration" equal to 2:1 and increasing the difference between the N concentration and the Al concentration from $10^{20}$ cm$^{-3}$ to $10^{22}$ cm$^{-3}$.

Furthermore, if the ratio of the N concentration becomes higher than 2:1, the original deep donor levels are formed by the extra N that exceeds "N concentration:Al concentration=2:1". The donor levels receive carrier electrons, and the shallow donor levels formed with trimers become empty. The excess N left out from "N concentration:Al concentration=2:1" is similar to N introduced independently. Therefore, strain relaxation is difficult. As a result, the sheet resistance rapidly increases as shown in FIG. 14.

In FIG. 14, the target for comparison is the sheet resistance (approximately 300Ω/□ in this case) in a case where N (nitrogen) as the n-type impurity is implanted almost up to the solid solubility limit when co-doping with Al is not performed, and changes in the sheet resistance value seen when "N concentration:Al concentration" is changed from 2:1 are shown.

The following description centers around "Al concentration/N concentration=0.5", at which trimer structures are formed. In a case where "Al concentration/N concentration" is not lower than 0.47 and not higher than 0.60 (100% of the carriers of $8\times10^{19}$ cm$^{-3}$ or higher being free carriers), or where the p-type impurity is implanted at 47% to 60% with respect to the n-type impurity, the sheet resistance is two digits lower than the sheet resistance obtained in a case co-doping with Al is not performed. Such a concentration ratio is highly advantageous. When the ratio is lower than 0.5, shallow levels decrease, and strain is caused. As a result, the number of free carriers decreases, and carriers equivalent to $8\times10^{19}$ cm$^{-3}$ are obtained when the ratio is approximately 0.47.

In a case where the range is widened in both directions, and "Al concentration/N concentration" is not lower than 0.45 and not higher than 0.75 (100% of the carriers of $5\times10^{19}$ cm$^{-3}$ or higher being free carriers), or where Al is implanted at 45% to 75% with respect to N, the sheet resistance ranges from a two-digit-lower resistance to a resistance almost three times higher than the two-digit-lower resistance. When the ratio is lower than 0.5, shallow levels decrease, and strain is caused. As a result, the number of free carriers decreases, and carriers equivalent to $5\times10^{19}$ cm$^{-3}$ are obtained when the ratio is approximately 0.45. In a case where the range is further widened in both directions and "Al concentration/N concentration" is higher than 0.40 but lower than 0.95 (100% of the carriers of $1\times10^{19}$ cm$^{-3}$ or higher being free carriers), or where Al is implanted at 40% to 95% with respect to N, the sheet resistance becomes one digit lower. When the ratio is lower than 0.5, shallow levels decrease, and strain is caused. As a result, the number of free carriers decreases, and carriers equivalent to $1\times10^{19}$ cm$^{-3}$ are obtained when the ratio is approximately 0.40.

Better characteristics are achieved on the side where Al is implanted at 50% or more with respect to N, because strain is sufficiently relaxed. The 50% state is the state where two N atoms and one Al atom are clustered to form a trimer. When the ratio is lower than 50%, trimers are formed, and extra N exists. Since there is N that cannot form trimers, an equivalent amount of strain accumulates. N that cannot form trimers is the same as that introduced independently, and reaches the limit of strain in no time. When the amount of Al is lower than 50%, strain rapidly occurs, and lattice defects increase. Therefore, the sheet resistance rapidly deteriorates when the ratio is lower than 50%, compared with that in a case where the ratio is 50% or higher at which strain can be relaxed.

When "Al concentration/N concentration" is 0.995, the number of carriers is almost the same as that in a case where co-doping is not performed. Since 100% of the carriers of $1\times10^{18}$ cm$^{-3}$ or higher, which is 0.5% of $2\times10^{20}$ cm$^{-3}$, are free carriers, the sheet resistance to be obtained with conventional nitrogen doping can be realized. Accordingly, the sheet resistance is almost the same as that in a case where co-doping is not performed. In a case where "Al concentration/N concentration" is 0.33 or where "N concentration:Al concentration" is 3:1, all carrier electrons are received not by shallow donor levels formed with trimers but by deep donor levels formed with extra N. Accordingly, the sheet resistance is almost the same as that in a case where co-doping is not performed. Therefore, the resistance is lowered by co-doping in cases where "Al concentration/N concentration" is higher than 0.33 but lower than 0.995, or where Al is implanted at 33 to 99.5% with respect to N. With the margin of error being taken into account, it can be considered that the ratio of Al to N should be higher than 33% but lower than 100%.

When the Al concentration is higher than the N concentration (Al concentration >N concentration), extra Al generated as a result of formation of Al—N pairs through interaction is also stabilized by displacing Si located in the vicinities of the Al—N pairs. Accordingly, shallow acceptor levels are formed. Also, strain is relaxed. Accordingly, the Al concentration can be made higher than that in a case where trimers are not formed. This case can be considered to be the same as the case where the N concentration is higher than the Al concentration.

Figure 15:
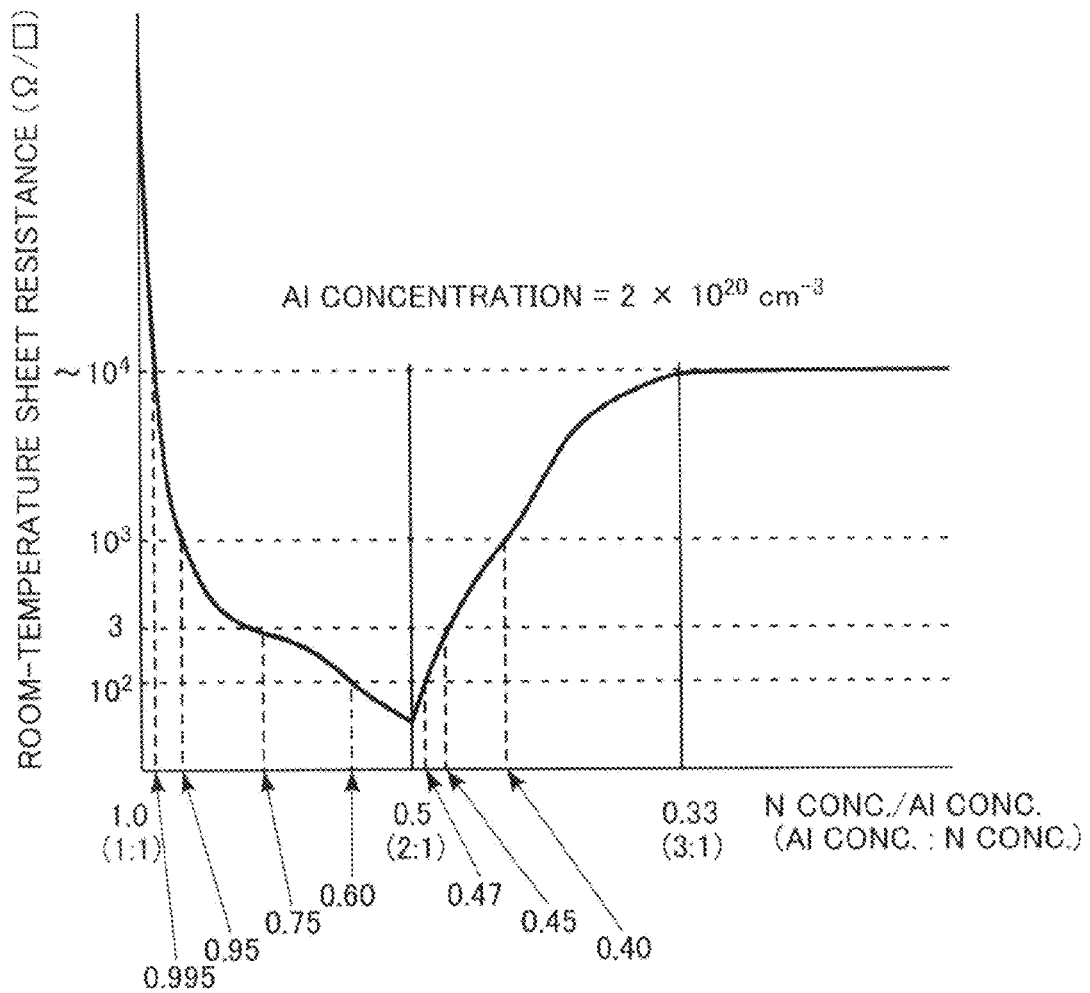
FIG. 15 is a diagram showing the relationship between N and Al concentrations and sheet resistance in the case of p-type SiC.

FIG. 15 is a diagram showing the relationship between N and Al concentrations and sheet resistance in the case of p-type SiC. The Al concentration is $2 \times 10^{20}$ cm$^{-3}$.

While "Al concentration:N concentration" is changing from 1:1 to 2:1, trimers are formed without strain, and the number of carrier holes in the shallow acceptor levels increases. Accordingly, the sheet resistance decreases.

When the ratio reaches 2:1, the maximum amount of carriers is available, and the sheet resistance becomes lowest. As shown in FIG. 15, the sheet resistance can be lowered down to approximately 40Ω/□. The contact resistance to p-type SiC can also be lowered from approximately $10^{-5}$ Ωcm$^3$ to approximately $10^{-7}$ Ωcm$^3$ by making "Al concentration:N concentration" equal to 2:1 and increasing the difference between the Al concentration and the N concentration from $10^{20}$ cm$^{-3}$ to $10^{22}$ cm$^{-3}$.

Furthermore, if the ratio of the Al concentration becomes higher than 2:1, the original deep acceptor levels are formed by the extra Al that exceeds "Al concentration:N concentration=2:1". The acceptor levels receive carrier holes, and the shallow acceptor levels formed with trimers are filled with electrons. The excess Al left out from "Al concentration:N concentration=2:1" is similar to Al introduced independently. Therefore, strain relaxation is difficult. As a result, the sheet resistance rapidly increases as shown in FIG. 15.

In FIG. 15, the target for comparison is the sheet resistance (approximately 10 KΩ/□ in this case) in a case where Al (aluminum) as the p-type impurity is implanted almost up to the solid solubility limit when co-doping with N is not performed, and changes in the sheet resistance value seen when "Al concentration:N concentration" is changed from 2:1 are shown.

The following description centers around "N concentration/Al concentration=0.5", at which trimer structures are formed. In a case where "N concentration/Al concentration" is not lower than 0.47 and not higher than 0.60 (100% of the carriers of $8 \times 10^{19}$ cm$^{-3}$ or higher being free carriers), or where the n-type impurity is implanted at 47% to 60% with respect to the p-type impurity, the sheet resistance is two digits lower than the sheet resistance obtained in a case co-doping with N is not performed. Such a concentration ratio is highly advantageous. When the ratio is lower than 0.5, shallow levels decrease, and strain is caused. As a result, the number of free carriers decreases, and carriers equivalent to $8 \times 10^{19}$ cm$^{-3}$ are obtained when the ratio is approximately 0.47.

In a case where the range is widened in both directions, and "N concentration/Al concentration" is not lower than 0.45 and not higher than 0.75 (100% of the carriers of $5 \times 10^{19}$ cm$^{-3}$ or higher being free carriers), or where N is implanted at 45% to 75% with respect to Al, the sheet resistance ranges from a two-digit-lower resistance to a resistance almost three times higher than the two-digit-lower resistance. When the ratio is lower than 0.5, shallow levels decrease, and strain is caused. As a result, the number of free carriers decreases, and carriers equivalent to $5 \times 10^{19}$ cm$^{-3}$ are obtained when the ratio is approximately 0.45. In a case where the range is further widened, "N concentration/Al concentration" is higher than 0.40 but lower than 0.95 (100% of the carriers of $1 \times 10^{19}$ cm$^{-3}$ or higher being free carriers), or where N is implanted at 40% to 95% with respect to Al, the sheet resistance becomes one digit lower. When the ratio is lower than 0.5, shallow levels decrease, and strain is caused. As a result, the number of free carriers decreases, and carriers equivalent to $1 \times 10^{19}$ cm$^{-3}$ are obtained when the ratio is approximately 0.40.

Better characteristics are achieved in cases where N is implanted at 50% or more with respect to Al, because strain is sufficiently relaxed. When N is less than 50%, on the other hand, trimers formed with one N atom and two Al atoms that are clustered account for 50% of the entire structure, and further, Al exists therein. Since there is Al that cannot form trimers, an equivalent amount of strain accumulates. When the amount of N is lower than 50%, strain rapidly occurs, and lattice defects increase. Therefore, the sheet resistance rapidly deteriorates when the ratio is lower than 50%, compared with that in a case where the ratio is 50% or higher at which strain can be relaxed.

At this point, "N concentration/Al concentration" is 0.995, and the number of carriers is almost the same as that in a case where co-doping is not performed. Since 100% of the carriers of $1 \times 10^{18}$ cm$^{-3}$ or higher, which is 0.5% of $2 \times 10^{20}$ cm$^{-3}$, are free carriers, the sheet resistance to be achieved with conventional Al doping can be realized. Accordingly, the sheet resistance is almost the same as that in a case where co-doping is not performed. In a case where "N concentration/Al concentration" is 0.33 or where "Al concentration:N concentration" is 3:1, all carrier holes are received not by shallow acceptor levels formed with trimers but by deep acceptor levels formed with extra Al. Accordingly, the sheet resistance is almost the same as that in a case where co-doping is not performed. Therefore, a resistance lowering effect is achieved by co-doping in cases where "N concentration/Al concentration" is higher than 0.33 but lower than 0.995, or where N is implanted at 33% to 99.5% with respect to Al. With the margin of error being taken into account, it can be considered that the ratio of Al to N should be higher than 33% but lower than 100%.

When co-doping is not performed, a low-resistance SiC semiconductor material containing impurities having low concentrations of $1 \times 10^{18}$ cm$^{-3}$ or lower cannot exist. However, when trimers are formed by co-doping, shallow levels are formed, and the number of carriers increases. Accordingly, a reduction in resistance can be achieved with small amounts of impurities.

Co-doping with the p-type impurity and the n-type impurity at an appropriate ratio as described above can achieve at least two notable effects.

First, strain is relaxed, and SiC with less strain can be formed. Compared with a case where co-doping is not performed, strain is smaller, the number of defects is smaller, and larger amounts of impurities can be implanted. That is, the solid solubility limits of impurities can be raised. Accordingly, the sheet resistance, the resistivity, and the contact resistance are lowered. As fewer defects are formed by either ion implantation or epitaxial growth, dosing of large amounts of impurities can be performed.

Secondly, shallow levels can be formed. Compared with a case where co-doping is not performed, a low-resistance material can be formed with smaller amounts of impurities. Alternatively, a sheet resistance that is one or more digits lower can be achieved with the same amounts of impurities as those in a case where co-doping is not performed. When considering a low-dose region In a region that can be formed through epitaxial growth, the resistance becomes higher unless co-doping is performed. However, low-resistance SiC can be formed when co-doping is performed. Accordingly, a SiC semiconductor device having a lower on-state resistance can be manufactured.

Figure 16A:
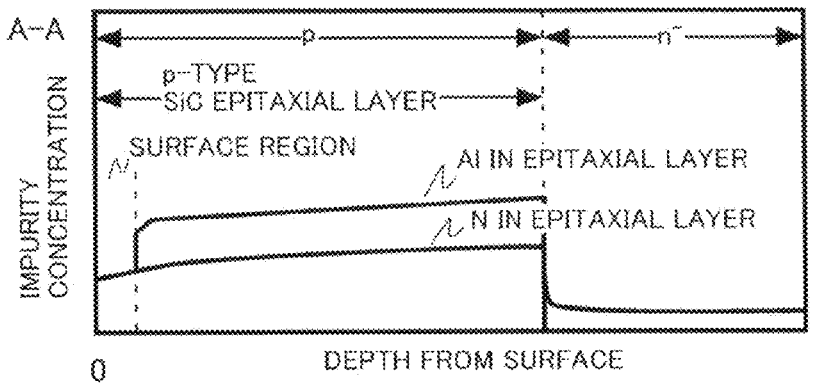
FIGS. 16A through 16D are graphs showing depth-direction impurity profiles of the semiconductor device of the first embodiment.
Figure 16B:
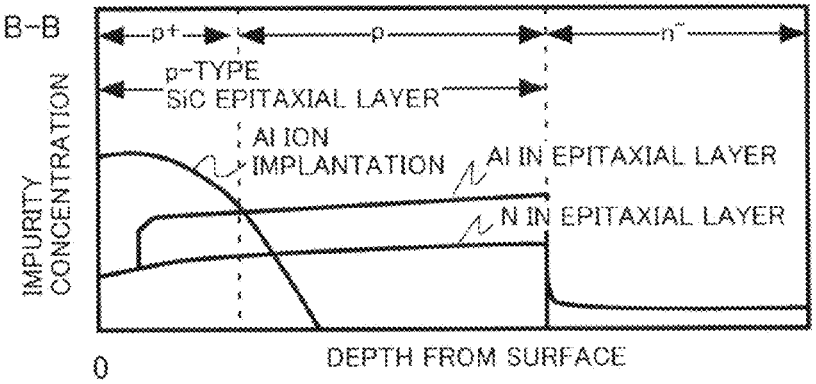
Figure 16C:
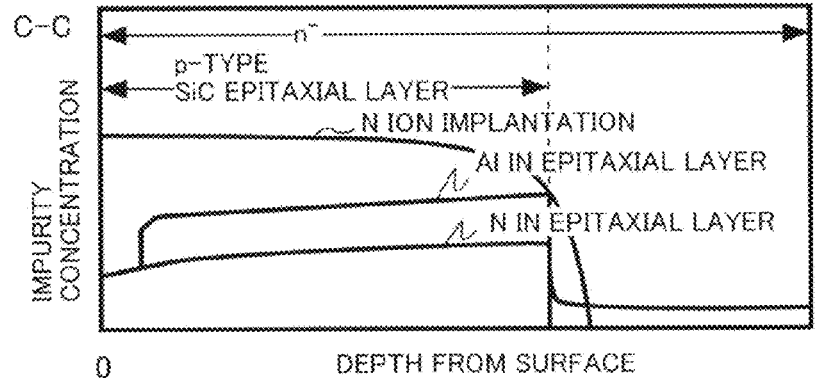
Figure 16D:
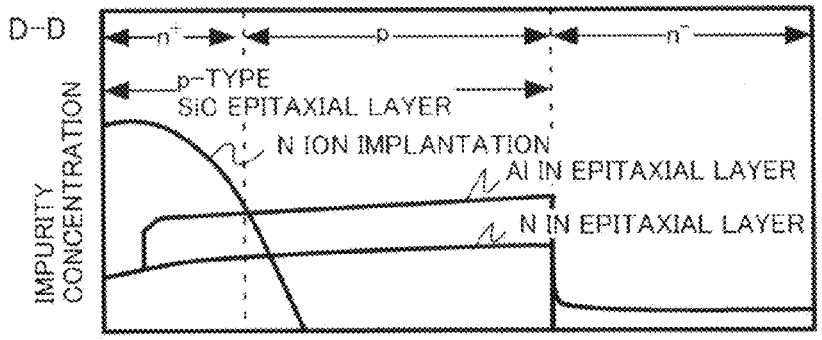

FIGS. 16A through 16D are graphs showing depth-direction impurity profiles of the semiconductor device of this embodiment. FIG. 16A shows the profiles of the surface region 19 and the p-well region 16 indicated by A-A in FIG. 1. FIG. 16B shows the profile of the p-well contact region 20 indicated by B—B in FIG. 1. FIG. 16C shows the profile of the JFET region 17 indicated by C—C in FIG. 1. FIG. 16D shows the profile of the source region 18 indicated by D-D in FIG. 1.

In the MOSFET 100 of this embodiment, the p-type second SiC epitaxial layer (the p-well region) 16 is co-doped with Al and N. The ratio of the N concentration to the Al concentration is higher than 0.33 but lower than 1.0.

First, in this embodiment, the impurity concentrations in the surface region 19 to be the channel region can be adjusted by impurity doping at the time of epitaxial growth. Accordingly, there is no need to implant ions into the channel region so as to adjust the threshold value of the MOSFET 100. As a result, defects due to ion implantation are not occurred. Accordingly, electron scattering due to ion implantation defects does not occur. Thus, the electron mobility in the channel region becomes higher, and a sophisticated MOSFET is realized.

The ratio between the p-type impurity and the n-type impurity is made to approximate 1:1, so that the surface region 19 becomes similar or close to an intrinsic (i-type) region, and the crystal strain in the channel portion is reduced. Accordingly, electron scattering due to crystal strain is reduced. Also, as the surface region 19 having low impurity concentrations is provided, the channel through which electrons flow can be made deeper. Accordingly, electron scattering in the insulating film 28 and the semiconductor interface is reduced. Thus, the electron mobility in the channel region becomes higher, and the sophisticated MOSFET 100 is realized.

As shown in FIG. 16A, in the upper portion of the second SiC epitaxial layer 16, the surface region 19 in which the impurity concentrations are low, and the ratio between the p-type impurity and the n-type impurity is close to 1:1 is formed. The p-type impurity concentration is made high in the lower portion of the second SiC epitaxial layer 16, so that the breakdown voltage of the device can be secured. With these impurity profiles, the MOSFET 100 that has a high breakdown voltage and a low on-state resistance is realized.

As shown in FIG. 16B, in the p-well contact region 20, the p-type impurity (Al) of the p-type second SiC epitaxial layer (the p-well region) 16 exists in the background in the first place. Accordingly, the dose amount of the p-type impurity for the ion implantation for forming the p-well contact region 20 can be reduced. Thus, the ion implantation time can be shortened, and lattice damage due to ion implantation can be reduced.

Also, the crystal defects due to the thermal stress generated at the time of the annealing for activating the p-type impurity and at the time of the cooling after that, particularly the dislocation on the base surface, can prevent the forward characteristics of the body diode of the MOSFET 100 from deteriorating. Thus, a highly-reliable MOSFET is realized.

As shown in FIG. 16C, in the JFET region 17, the n-type impurity (N) of the p-type second SiC epitaxial layer (the p-well region) 16 exists in the background in the first place. Accordingly, the dose amount of the n-type impurity for the ion implantation for forming the JFET region 17 can be reduced. Thus, the ion implantation time can be shortened, and lattice damage due to ion implantation can be reduced.

In this embodiment, as shown in FIG. 16B, the impurity concentration of the p-type impurity (Al) in the p-type second SiC epitaxial layer (the p-well region) 16 preferably becomes higher in the depth direction from the surface. This is because, with this structure, the p-type impurity concentration in the body diode of the MOSFET 100 will become higher, and the breakdown voltage of the body diode will improve.

In a case where the p-type impurity (the second p-type impurity) is an element A while the n-type impurity (the second n-type impurity) is an element D in the JFET region 17 shown in FIG. 16C, the element A and the element D preferably form a combination of Al (aluminum), Ga (gallium), or In (indium) and N (nitrogen), and/or a combination of B (boron) and P (phosphorus). The ratio of the concentration of the element A to the concentration of the element D in the combination(s) is preferably higher than 0.40 but lower than 0.95. This is because the trimer formation in the JFET region 17 will be facilitated, and a low-resistance n-layer with fewer defects will be realized. In this case, the concentration of the element D forming part of the above combination (s) is preferably not lower than $1\times10^{18}$ cm$^{-3}$.

Second Embodiment

A semiconductor device of this embodiment is an IGBT (Insulated Gate Bipolar Transistor). The structure of the semiconductor device is the same as that of the first embodiment, except that a p$^+$-type collector region is formed on the side of the bottom plane of the n-type first SiC epitaxial layer, and a second electrode (a collector electrode) is formed in contact with the p$^+$-type collector region. In the description below, the same explanations as those about the function and effects of co-doping and the like in the first embodiment will not be repeated.

Figure 17:
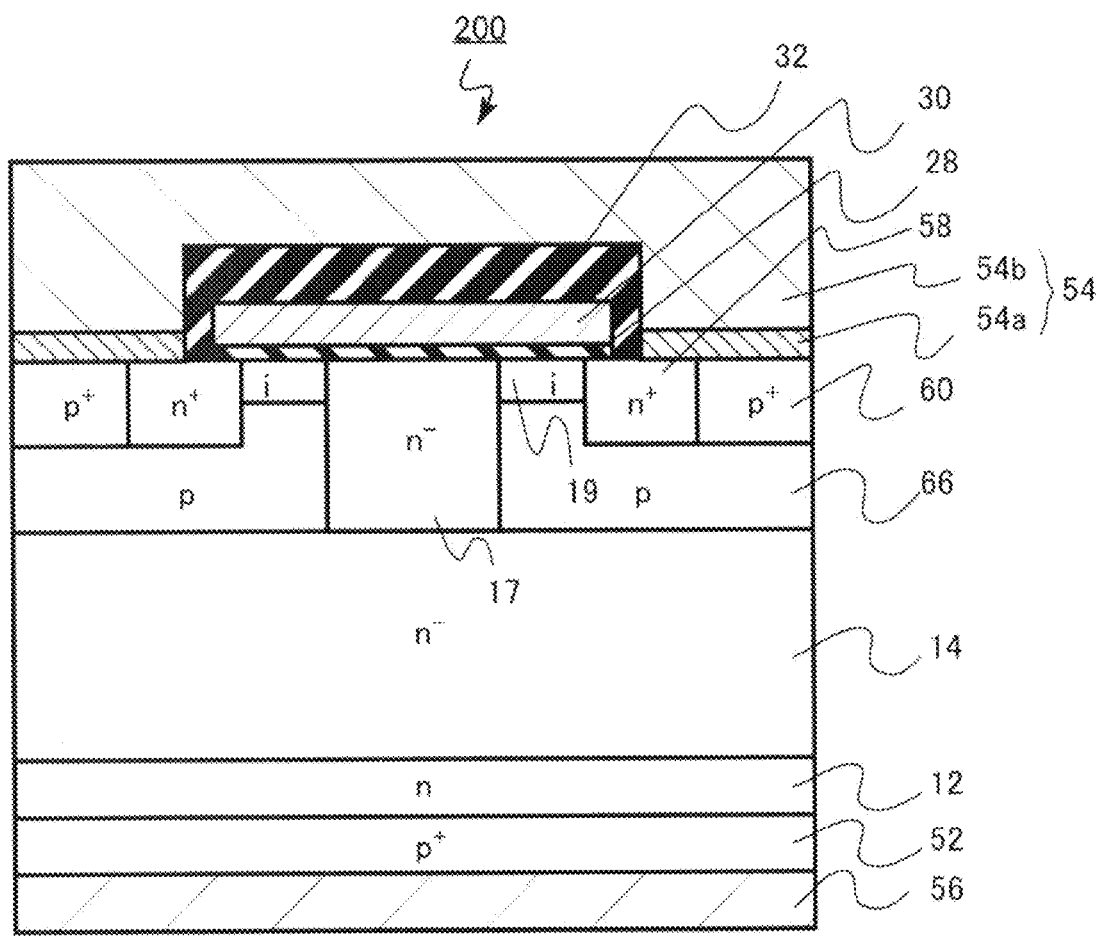
FIG. 17 is a schematic cross-sectional view of a semiconductor device of a second embodiment.

FIG. 17 is a schematic cross-sectional view of the structure of an IGBT that is the semiconductor device of this embodiment. The IGBT 200 is a vertical IGBT.

This IGBT 200 includes a SiC substrate (a silicon carbide substrate) 12 having first and second planes. In FIG. 17, the first plane is the upper plane, and the second plane is the lower plane. This SiC substrate 12 is a 4H—SiC substrate (an n-substrate) containing N (nitrogen) as an n-type impurity at an impurity concentration that is not lower than $1\times10^{18}$ cm$^{-3}$ and not higher than $1\times10^{19}$ cm$^{-3}$, for example.

An n-type first SiC epitaxial layer (an n$^-$-SiC layer) 14 containing the n-type impurity at an impurity concentration that is not lower than $5\times10^{15}$ cm$^{-3}$ and not higher than $2\times10^{16}$ cm$^{-3}$, for example, is formed on the first plane of the SiC substrate 12. The thickness of the n$^-$-SiC layer 14 is not smaller than 5 μm and not greater than 10 μm, for example.

A p-type second SiC epitaxial layer (a first emitter region) 66 containing a p-type impurity at an impurity concentration that is not lower than $1\times10^{16}$ cm$^{-3}$ and not higher than $5\times10^{17}$ cm$^{-3}$, for example, is formed on the n$^-$-SiC layer 14. The depth of the first emitter region 66 is not smaller than 0.3 μm and not greater than 1.0 μm, for example.

The p-type second SiC epitaxial layer (the first emitter region) 66 is co-doped with a p-type impurity (a first p-type impurity) and an n-type impurity (a first n-type impurity). Where the p-type impurity is an element A and the n-type impurity is an element ID, the element A and the element ID form a combination of Al (aluminum), Ga (gallium), or In (indium) and N (nitrogen) (a first combination), and/or a combination of B (boron) and P (phosphorus) (a second combination). The ratio of the concentration of the element D to the concentration of the element A in the above combination (s) is higher than 0.33 but lower than 1.0. The concentration of the element A forming part of the above combination (s) is preferably not lower than $1\times10^{16}$ cm$^{-3}$ and not higher than $5\times10^{17}$ cm$^{-3}$, so as to set an appropriate threshold value in the IGBT 200.

A surface region 19 is formed in part of the surface of the p-type second SiC epitaxial layer (the first emitter region) 66. The surface region 19 and the p-well region 16 located there under function as the channel region. The surface region 19 is also formed with an epitaxial layer.

An n$^-$-type first SiC region (a JFET region) 17 containing an n-type impurity at an impurity concentration of $5\times10^{15}$ to $1\times10^{19}$ cm$^{-3}$, for example, is formed in part of the surface of the p-type second SiC epitaxial layer (the first emitter region) 66. The depth of the JFET region 17 is equal to or greater than the thickness of the first emitter region 66. The JFET region 17 is connected to the n$^-$-SiC layer 14. The JFET region 17 functions as a transfer path for electrons serving as carriers.

An n$^+$-type second SiC region (a second emitter region) 58 containing an n-type impurity at an impurity concentration of $1\times10^{18}$ to $1\times10^{22}$ cm$^{-3}$, for example, is formed in part of the surface of the p-type second SiC epitaxial layer (the first emitter region) 66. The depth of the second emitter region 58 is smaller than the thickness of the second SiC epitaxial layer (the first emitter region) 66, and is approximately 0.3 μm, for example. The second emitter region 58 is provided at a distance from the JFET region 17, with the first emitter region 66 being interposed in between.

A p$^+$-type third SiC region (an emitter contact region) 60 containing a p-type impurity at an impurity concentration of $1\times10^{18}$ to $1\times10^{22}$ cm$^{-3}$, for example, is formed in part of the surface of the second SiC epitaxial layer (the first emitter region) 66 and on a side of the n$^+$-type second SiC region (the second emitter region) 58. The depth of the emitter contact region 60 is smaller than the thickness of the second SiC epitaxial layer (the first emitter region) 66, and is approximately 0.3 μm, for example.

A p$^+$-type fourth SiC region (a collector region, a p-type SiC layer) 52 containing a p-type impurity at an impurity concentration of $1\times10^{18}$ to $1\times10^{22}$ cm$^{-3}$, for example, is formed on the side of the bottom plane of the n-type SiC layer 14. In this embodiment, the bottom plane of the SiC substrate 12 is the p$^+$-type fourth SiC region 52.

A gate insulating film 28 is continuously formed in the surfaces of the JFET region 17 and the second SiC epitaxial layer (the first emitter region) 66, so as to extend across the region and the layer. The gate insulating film 28 may be an SiO$_2$ film or a high-k insulating film, for example.

A gate electrode 30 is formed on the gate insulating film 28. The gate insulating film 28 may be an SiO$_2$ film, for example. The gate electrode 30 may be made of polysilicon, for example. An interlayer insulating film 32 formed with an SiO$_2$ film, for example, is formed on the gate electrode 30.

The second SiC epitaxial layer 66 that is located below the gate electrode and is interposed between the second SiC region (the second emitter region) 58 and the JFET region 17 serves as the channel region.

A conductive first electrode (an emitter electrode) 54 that is electrically connected to the second SiC region (the second emitter region) 58 and the third SiC region (the emitter contact region) 60 is provided. The first electrode (the emitter electrode) 54 is formed with a Ni (nickel) barrier metal layer 54a and an Al metal layer 54b formed on the barrier metal layer 54a, for example. The Ni barrier metal layer 54a and the Al metal layer 54b may form an alloy through a reaction.

A conductive second electrode (a collector electrode) 56 is formed on the side of the second plane of the SiC substrate 12 and on the bottom plane of the fourth SiC region 52. The second electrode (the collector electrode) 56 is made of Ni, for example.

In this embodiment, the n-type impurity is preferably N (nitrogen) or P (phosphorus), for example, but it is possible to use As (arsenic) or the like. Also, the p-type impurity is preferably Al (aluminum), for example, but it is possible to use B (boron), Ga (gallium), In (indium), or the like.

The semiconductor device of this embodiment can be manufactured by a method that is the same as the manufacturing method according to the first embodiment, except that ions of Al as the p-type impurity are implanted into the bottom plane (the second plane) of the SiC substrate 12, to form the fourth SiC region (the collector region) 52 prior to the formation of the second electrode, for example.

So as to make the n-type region thinner, the step of grinding the bottom plane of the SiC substrate 12 may be additionally carried out prior to the formation of the p-type collector region 52, for example.

In the IGBT 200 of this embodiment, the p-type second SiC epitaxial layer (the first emitter region) 66 is co-doped with Al and N. The ratio of the N concentration to the Al concentration is higher than 0.33 but lower than 1.0. Accordingly, the sophisticated, highly-reliable IGBT 200 is realized by virtue of the same effects as those of the first embodiment.

Although silicon carbide crystalline structures are 4H—SiC in the above described embodiments, the embodiments can also be applied to silicon carbides having other crystalline structures such as 6H—SiC and 3C—SiC.

Also, in the above described embodiments, the combination of a p-type impurity and an n-type impurity is a combination of Al (aluminum) and N (nitrogen). However, the combination is not limited to that, and the same effects as above can be achieved, as long as the combination is a combination of Al (aluminum), Ga (gallium), or In (indium) and N (nitrogen), and/or a combination of B (boron) and P (phosphorus).

In each of the first and second embodiments, the n-type SiC substrate used in the manufacture is left in the final structure of the MOSFET or the IGBT. However, the n-type SiC substrate may be completely removed by polishing or the like, so as to reduce the thickness of the device, for example.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   an n-type first SiC epitaxial layer;
   a p-type second SiC epitaxial layer provided on the first SiC epitaxial layer, the p-type second SiC epitaxial layer containing a p-type impurity and an n-type impurity, the p-type impurity being an element A, the n-type impurity being an element D, the element A and the element D forming at least one of a first combination or a second combination, the first combination being a combination of the element A selected from a group consisting of Al (aluminum), Ga (gallium), and In (indium) and the element D being N (nitrogen), the second combination being a combination of the element A being B (boron) and the element D being P (phosphorus), a ratio of a concentration of the element D to a concentration of the element A in the at least one of the combinations being higher than 0.33 but lower than 1.0;

a surface region provided at a surface of the p-type second SiC epitaxial layer, the surface region containing the element A at a lower concentration than the concentration of the element A in the p-type second SiC epitaxial layer, a ratio of a concentration of the element D to concentration of the element A in the at least one of the combinations being higher than the ratio in the p-type second SiC epitaxial layer;

an n-type first SiC region provided at the surface of the p-type second SiC epitaxial layer, the n-type first SiC region having a depth equal to or greater than a thickness of the p-type second SiC epitaxial layer;

an n-type second SiC region provided at the surface of the p-type second SiC epitaxial layer, the n-type second SiC region being separated from the n-type first SiC region, the n-type second SiC region having a depth smaller than the thickness of the p-type second SiC epitaxial layer;

a gate insulating film provided on the surface region;

a gate electrode provided on the gate insulating film;

a first electrode provided on the n-type second SiC region; and a second electrode provided on the opposite side of the n-type first SiC epitaxial layer from the first electrode.

2. The device according to claim 1, wherein the ratio of the concentration of the element D to the concentration of the element A in the at least one of the combinations in the surface region is not lower than 0.9 and not higher than 1.1.

3. The device according to claim 2, wherein the concentration of the element A forming at least one of the combinations in the p-type second SiC epitaxial layer is not lower than $1\times10^{16}$ cm$^{-3}$ and not higher than $5\times10^{17}$ cm$^{-3}$.

4. The device according to claim 3, wherein the ratio of the concentration of the element D to the concentration of the element A in the at least one of the combinations in the p-type second SiC epitaxial layer is higher than 0.40 but lower than 0.95.

5. The device according to claim 1, wherein the concentration of the element A forming at least one of the combinations in the p-type second SiC epitaxial layer is not lower than $1\times10^{16}$ cm$^{-3}$ and not higher than $5\times10^{17}$ cm$^{-3}$.

6. The device according to claim 1, wherein the ratio of the concentration of the element D to the concentration of the element A in the at least one of the combinations in the p-type second SiC epitaxial layer is higher than 0.40 but lower than 0.95.

7. The device according to claim 1, wherein an acceptor level of the element A forming at least one of the combinations in the p-type second SiC epitaxial layer is 150 meV or lower.

8. The device according to claim 1, wherein 90% or more of the element D forming at least one of the combinations in the second SiC epitaxial layer is in a lattice site location nearest to the element A.

9. The device according to claim 1, further comprising
an n-type SiC layer provided on the opposite side of the n-type first SiC epitaxial layer from the p-type second SiC epitaxial layer,
wherein the second electrode is in contact with the n-type SiC layer.

10. The device according to claim 1, further comprising
a p-type SiC layer provided on the opposite side of the n-type first SiC epitaxial layer from the p-type second SiC epitaxial layer,
wherein the second electrode is in contact with the SiC layer.

* * * * *

UNITED STATES PATENT AND TRADEMARK OFFICE
CERTIFICATE OF CORRECTION

PATENT NO. : 9,012,923 B2  
APPLICATION NO. : 14/448345  
DATED : April 21, 2015  
INVENTOR(S) : Johji Nishio et al.

Page 1 of 1

It is certified that error appears in the above-identified patent and that said Letters Patent is hereby corrected as shown below:

On the title page, Item (30), the Foreign Application Priority Data has been omitted. Please insert Item (30):

-- (30)      Foreign Application Priority Data

August 1, 2013    (JP) ........................................ 2013-160782 --

Signed and Sealed this  
First Day of September, 2015

Michelle K. Lee  
*Director of the United States Patent and Trademark Office*